US005617091A

United States Patent [19]

Uda

[11] Patent Number: 5,617,091
[45] Date of Patent: Apr. 1, 1997

[54] RESISTANCE LADDER, D-A CONVERTER, AND A-D CONVERTER

[75] Inventor: Nobuya Uda, Itami, Japan

[73] Assignee: Lowe, Price, LeBlanc & Becker, Alexandria, Va.

[21] Appl. No.: 490,270

[22] Filed: Jun. 14, 1995

[30] Foreign Application Priority Data

Sep. 2, 1994 [JP] Japan .................................. 6-209919

[51] Int. Cl.$^6$ ........................................................ H03M 1/78
[52] U.S. Cl. ............................................... 341/154; 341/148
[58] Field of Search .................................... 341/154, 153, 341/148, 145, 144

[56] References Cited

U.S. PATENT DOCUMENTS

| | | |
|---|---|---|
| 879,646 | 2/1908 | Jones . |
| 968,329 | 8/1910 | Dawson . |
| 4,198,622 | 4/1980 | Connolly, Jr. et al. .................. 341/145 |
| 4,647,903 | 3/1987 | Ryu . |
| 4,742,329 | 5/1988 | Yamada et al. ......................... 341/154 |
| 5,126,740 | 6/1992 | Kawada .................................. 341/144 |
| 5,495,245 | 2/1996 | Ashe ....................................... 341/145 |

FOREIGN PATENT DOCUMENTS

| | | |
|---|---|---|
| 87480013.9 | 10/1987 | European Pat. Off. . |
| 0310728A1 | 4/1989 | European Pat. Off. . |
| 2905116C2 | 12/1989 | Germany . |
| 54-151368 | 11/1979 | Japan . |
| 62-227224A | 10/1987 | Japan . |
| 197020 | 4/1989 | Japan . |

Primary Examiner—Howard L. Williams
Attorney, Agent, or Firm—Lowe, Price, LeBlanc & Becker

[57] ABSTRACT

A resistance ladder which divides a potential difference between two power sources into $2^m$ levels by a resistance group in the center portion, then adjusting the number of resistors which are disposed at the both end portions of the resistance ladder and interposed between the resistors of the center portion and the two power sources so that the division voltages of $2^m$ levels are changed in (n-m) levels, with the result that the potential difference is divided into $2^n$ levels. A D-A converter uses the resistance ladder. An A-D converter with the D-A converter which generates a reference voltage to be compared with an input voltage.

48 Claims, 20 Drawing Sheets

CASE THAT COMPARISON
RESULT OF 5TH BIT IS "1"

CASE THAT COMPARISON
RESULT OF 5TH BIT IS "0"

RESISTANCE LADDER, D-A CONVERTER, AND A-D CONVERTER

BACKGROUND OF THE INVENTION

1. Field of the Invention

The invention relates to a resistance ladder, a D-A converter based on the resistance ladder, and an A-D converter using the D-A converter.

2. Description of the Prior Art

An A-D converter which converts an analog voltage into a digital value requires a reference voltage which is to be compared with a to-be-converted object, i.e., the analog voltage. In a typical A-D converter, an analog reference voltage for comparison is generated by a D-A converter using a resistance ladder in which plural resistors are connected in series.

FIG. 1 is a circuit diagram showing the configuration of main portions of a D-A converter of n-bit resolution which uses a conventional resistance ladder. This prior art example is a D-A converter of 4-bit resolution. In the figure, 1 designates a positive analog voltage source (VREF), and 2 designates a negative analog voltage source (AVSS). A resistance ladder 3 is connected to the positive and negative analog voltage sources 1 and 2. The resistance ladder 3 consists of: a string of resistors 4, 4, . . . in which ($2^n$-2) [=14] resistors 4 each having a resistance of R are connected in series; a resistor 6 which has a resistance of 3R/2, and through which one end of the string of resistors 4, 4, . . . is connected to the positive analog voltage source 1; and a resistor 5 which has a resistance of R/2, and through which the other end of the string of resistors 4, 4, . . . is connected to the negative analog voltage source 2. The resistance ladder 3 has a total resistance of 16·R, and divides the potential difference between the positive and negative analog voltage sources 1 and 2 into $2^4$ levels. Ladder taps T1 through T16 through which division voltages of $2^4$ levels are taken out are connected to the node between the resistor 5 of the resistance ladder 3 and the negative analog voltage source 2, and to the nodes between the other resistors, respectively.

A switching tree 7 comprises a group of switches 70 through 77 which are controlled so as to select one of the ladder taps T1 through T16 of the resistance ladder 3 to obtain an analog output 8. The on/off operations of the group of switches 70 through 77 are respectively controlled by the levels of digital signals a, $\bar{a}$, b, $\bar{b}$, c, $\bar{c}$, d and $\bar{d}$ which are supplied from an external control circuit (not shown) through word lines, and which indicate a 4-bit digital value "abcd" by means of positive and negative logic. The switches 70 through 77 are turned on when the digital signal corresponding to the letter assigned to the respective switch in FIG. 1 is "1". In other words, FIG. 1 shows a state that the digital value "abcd" is "$1010_2$" or the digital signals a, $\bar{b}$, c and $\bar{d}$ are "1" and the other digital signals are "0".

Table 1 shows the relationship between the digital value "abcd", analog voltages of the analog output 8 in the case where VREF and AVSS are 4 V and 0 V, respectively, and the ladder taps T1 through T16 from which the analog voltages are obtained. As seen also from the table, the ladder taps attain voltages in such a manner that the potential difference between the ladder tap T1 as the lowest tap of the resistance ladder from which the potential of AVSS is obtained, and the ladder tap T2 is 0.125 V, the potential difference between VREF and the ladder tap T16 is 0.375 V, and the potential difference between each adjacent two of the other ladder taps T2 through T15 are 0.25 V. In other words, voltages obtained by dividing the potential difference between VREF and AVSS into $2^4$ [=16] levels are taken through the ladder taps T1 through T16, respectively.

FIG. 2 shows a sequential approximation type A-D converter of 4-bit resolution which is disclosed in, for example, Japanese Patent Application Laid-Open No. 54-151368 (1979) (U.S. application Nos. 879,646, 968,329), and which uses the D-A converter of FIG. 1. In the figure, 9 designates a D-A converter of 4-bit resolution having the configuration of FIG. 1. The D-A converter 9 supplies an analog voltage of a 4-bit digital value which is one of the analog voltages obtained from the ladder taps T1 through T16 listed in Table 1, to a comparator 16 as a reference voltage to be compared with an analog input (AIN) 25 supplied from outside. A 4-bit control circuit 10 generates digital signals a, $\bar{a}$, b, . . . , $\bar{d}$ which correspond to the 4-bit digital value, and supplies the digital signals to the D-A converter 9 through word lines. Furthermore, the 4-bit control circuit 10 determines the 4-bit digital value on the basis of a comparison result signal 20 outputted from the comparator 16 which compares the analog input 25 with the analog output 8 of the D-A converter 9.

Next, a digital conversion conducted by the thus configured A-D converter in the case where the analog input 25 is 1.3 V will be described.

First, a digital signal corresponding to a digital value "$1000_2$" in which the highest-order bit "a" of the digital value "abcd" is set to be "1" is supplied to the D-A converter 9 in order to output the comparison reference voltage therefrom. The D-A converter 9 then supplies a voltage:

$$(VREF/2)-(VREF/32) \ [V](=1.875 \ V)$$

to the comparator 16. The comparator 16 compares the analog output 8 of the D-A converter 9 with the analog input (AIN) 25 as follows:

$$[(VREF/2)-(VREF/32)]:AIN$$

i.e., $$1.875 \ V:1.3 \ V$$

Since AIN is lower, the 4-bit control circuit 10 determines the digital value of the bit "a" to be "0" in accordance with the comparison result signal 20.

Then, a digital signal corresponding to a digital value "$0100_2$" in which the bit "b" is set to be "1" is supplied to the D-A converter 9 which in turn supplies a voltage:

$$(VREF/4)-(VREF/32)[V](=0.875 \ V)$$

to the comparator 16. The comparator 16 compares the analog output 8 of the D-A converter 9 with the analog input (AIN) 25 as follows:

$$[(VREF/4)-(VREF/32)]:AIN$$

i.e., $$0.875 \ V:1.3 \ V$$

Since AIN is higher, the 4-bit control circuit determines the digital value of the bit "b" to be "1" in accordance with the comparison result signal.

Then, a digital signal corresponding to a digital value "$0110_2$" in which the bit "c" is set to be "1" is supplied to the D-A converter 9. The D-A converter 9 supplies a voltage:

$$(3 \cdot VREF/8) - (VREF/32)[V] (=1.375\ V)$$

to the comparator 16. The comparator 16 compares the analog output 8 of the D-A converter 9 with the analog input (AIN) 25 as follows:

$$[(3 \cdot VREF/8) - (VREF/32)] : AIN$$

i.e., $$1.375\ V : 1.3\ V$$

Since AIN is lower, the 4-bit control circuit 10 determines the digital value of the bit "c" to be "0" in accordance with the comparison result signal.

Then, a digital signal corresponding to a digital value "$0101_2$" in which bit "d" is set to be "1" is supplied to the D-A converter 9 which in turn supplies a voltage:

$$(5 \cdot VREF/16) - (VREF/32)[V] (=1.125\ V)$$

to the comparator 16. The comparator 16 compares the analog output 8 of the D-A converter 9 with the analog input (AIN) as follows:

$$[(5 \cdot VREF/16) - (VREF/32)] : AIN$$

i.e., $$1.125\ V : 1.3\ V$$

Since AIN is higher, the 4-bit control circuit 10 determines the digital value of the bit "d" to be "1" in accordance with the comparison result signal.

As a result of the above-mentioned sequential comparison, the analog voltage 1.3 V of the input AIN is converted into a digital value "$0101_2$".

An A-D converter of 9-bit resolution can conduct an A-D conversion twice the accuracy when the resolution is 8-bit. Likewise, an A-D converter of 10-bit resolution can conduct an A-D conversion twice the accuracy of 9-bit resolution. As the resolution becomes higher, therefore, a value indicated by the resulting digital value more approximates an input analog value.

An A-D converter in which an analog reference voltage for comparison is generated by a D-A converter based on a resistance ladder has an advantage in the excellent linear conversion properties because the D-A converter based on the resistance ladder generates an analog reference voltage by using only resistors and therefore the resulting division voltages are correct as far as the resistors are uniformly irregular.

On the other hand, in the A-D converter of the above type, the D-A converter must generate division voltages of the corresponding number to the resolution of the A-D converter. Therefore, an A-D converter of 8-bit resolution requires at least $2^8 [=256]$ resistors. Similarly, an A-D converter of 9-bit resolution requires at least $2^9 [=512]$ resistors, and that of 10-bit resolution requires at least $2^{10} [=1024]$ resistors. That is, when the resolution is improved every one bit, the number of resistors must be doubled. Consequently, the A-D converter is disadvantageous in that the improvement of the resolution inevitably increases the device area and impairs the production yield thereby to increase the production cost of an LSI.

In order to eliminate the drawbacks discussed above, an improved circuit is disclosed in, for example, Japanese Patent Application Laid-Open No. 1-97020(1989). In an A-D conversion process conducted by the circuit, two adjacent ladder taps of a resistance ladder string are selected, another resistance ladder string having a resistance which is much higher than that between the above ladder taps is connected to the ladder taps, and the potential across the selected ladder taps is further divided by the resistor string of a higher resistance, thereby improving the resolution of an A-D converter.

Other prior art A-D converters using a D-A converter include a parallel A-D converter, and a serial-parallel A-D converter in which the D-A converter repeats a conversion process every plural bits in a sequence from a high-order bit to the lowest-order bit, and a comparison between an analog output of every plural bits and an analog input to be converted is repeated to conduct a digital conversion.

FIG. 3 is a circuit diagram showing the configuration of a prior art D-A converter which is used in a parallel A-D converter, or a serial-parallel A-D converter to convert a digital value into an analog value per p bits. The illustrated D-A converter of 4-bit resolution conducts an analog conversion per 2 bits. The D-A converter consists of a resistance ladder in which $2^n [=16]$ resistors are connected in series, $(2^p - 1) [=3]$ analog outputs 81, 82 and 83, and 15 selecting switches 701 through 715 which are used for obtaining the $(2^p - 1)$ analog outputs 81, 82 and 83 from the resistance ladder. An A-D converter using the D-A converter has $(2^p - 1)$ comparators (not shown) which are respectively connected to the analog outputs 81, 82 and 83, and compares an analog voltage input from outside with analog outputs of the D-A converter resulting from the analog conversions per 2 bits from a high-order bit, to convert the analog value into a digital value.

In the case where a resistance ladder having the configuration of FIG. 1 is employed in the above D-A converter, the improvement of the resolution requires an increase of the circuit scale, similar to the foregoing example. When a D-A converter of 6-bit resolution is to be realized in a configuration similar to that of the D-A converter of 4-bit resolution shown in FIG. 3, for example, the resistance ladder must be composed of at least 64 resistors and requires 62 switches.

In the circuit disclosed in Japanese Patent Application Laid-Open No. 1-97020 (1989) (EP Appl. No. 87480013.9), even when the resistors connected between two ladder taps have a very high resistance, the main current passing through the resistance ladder is theoretically shunted, so that the potential difference between the ladder taps to which the group of high resistance resistors is connected is reduced. In this case, the voltage across the ladder taps to which the group of high resistance resistors is connected is not equal to potential differences of the other ladder taps. Therefore, it is substantially impossible to eliminate an error caused by the reduced potential difference.

If the group of high resistance resistors has a resistance as high as 2,000 times the resistance between adjacent ladder taps of a first resistance ladder, an error due to the connection of the group of high resistance resistors can be reduced to an allowable range. However, even when the error can be reduced to an allowable range, when all the resistors are made of the same material, it is apparent that the group of high resistance resistors occupies a considerably large area.

The problem of a large area occupied by the group of high resistance resistors may be solved by using a material of a high resistivity. Theoretically, switches correcting the resistors of the group to the ladder taps may have a resistance. Unless the circuit is designed with due consideration of the resistance of each switch, therefore, it is impossible to correctly divide the potential difference between the reference voltage sources connected to the both ends of the resistance ladder. In order to configure the circuit in due consideration of the resistances of the switches, the switches must exhibit a uniform resistance at any of the ladder taps.

A D-A converter of 4-bit resolution is disclosed in FIGS. 4 and 5 of Japanese Patent Application Laid-Open No. 54-151368(1979) (U.S. application Nos. 879,646, 968,329), and a 12-bit A-D converter to which the D-A converter is applied is disclosed in FIG. 7. In the D-A converter, 3 unit resistors each having a resistance of R, and subsequently 4 resistors each having a resistance of R/4 are connected in series between a positive analog voltage source and a negative analog voltage source, thereby constituting a resistance ladder. Two analog voltages obtained from the group of the 3 resistors and that of the 4 resistors are supplied to non-inverting and inverting inputs of a buffer, respectively, so that an analog output is obtained in accordance with the difference between the two analog voltages.

In the disclosed converter, the resistance ladder is configured by a small number of resistors, and therefore the resistors occupy a small area. Since the number of the resistors is small, however, a total sum of resistances of the resistance ladder is smaller than that of a resistance ladder composed of series resistors. When the impedances of the positive and negative analog voltage sources are not sufficiently low, charging and discharging currents of a capacitance existing in the resistance ladder causes the analog voltage sources to fluctuate in the output level, with the result that the accuracy of the A-D converter is adversely influenced.

Since resistive component of conductors connecting the resistors each other greatly influence the resistance ladder when the whole resistance thereof is low, the resistance ladder should be composed with careful consideration also to the resistive component, which quantity is little, of the conductors.

In an A-D converter of 6-bit resolution using a D-A converter based on a series resistance ladder, there are 64 ladder taps and 64 paths extending between the ladder taps to an analog output through a switching tree. When the continuity of the ladder taps is to be checked, therefore, accuracy at 64 points must be tested while the A-D conversion is conducted.

At the inspection of LSIs before shipment, when an LSI has even a single faulty transistor in the whole circuit, the LSI is selected as a defective one. Generally, an A-D converter, and an LSI loading the A-D converter are subjected also to testing of the conversion accuracy of the A-D converter. If the A-D converter is composed of a resistance ladder, the testing must be conducted by the number corresponding to the resolution of the A-D converter. As the resolution becomes higher, therefore, the number of testing points is increased so that the test time is lengthen, thereby causing the production cost to be increased.

SUMMARY OF THE INVENTION

The invention has been conducted in order to solve these problems. It is an object of the invention to provide an A-D converter of a high conversion accuracy in which an analog conversion is done by means of a resistance ladder configured in a similar manner as that of a conventional resistance ladder, the resulting analog output is changed in plural levels by changing a connecting path between positive and negative analog voltage sources to expand the degree of the resolution, whereby the resolution of a higher degree is realized with a small number of parts.

It is another object of the invention to provide an A-D converter of a higher resolution enabling labor-saving testing thereof, thereby lowering the cost of the converter.

The above and further objects and features of the invention will more fully be apparent from the following detailed description with accompanying drawings.

DESCRIPTION OF THE PREFERRED EMBODIMENTS

Hereinafter, the invention will be described with reference to the figures showing its embodiments.

Embodiment 1

Figure 4:
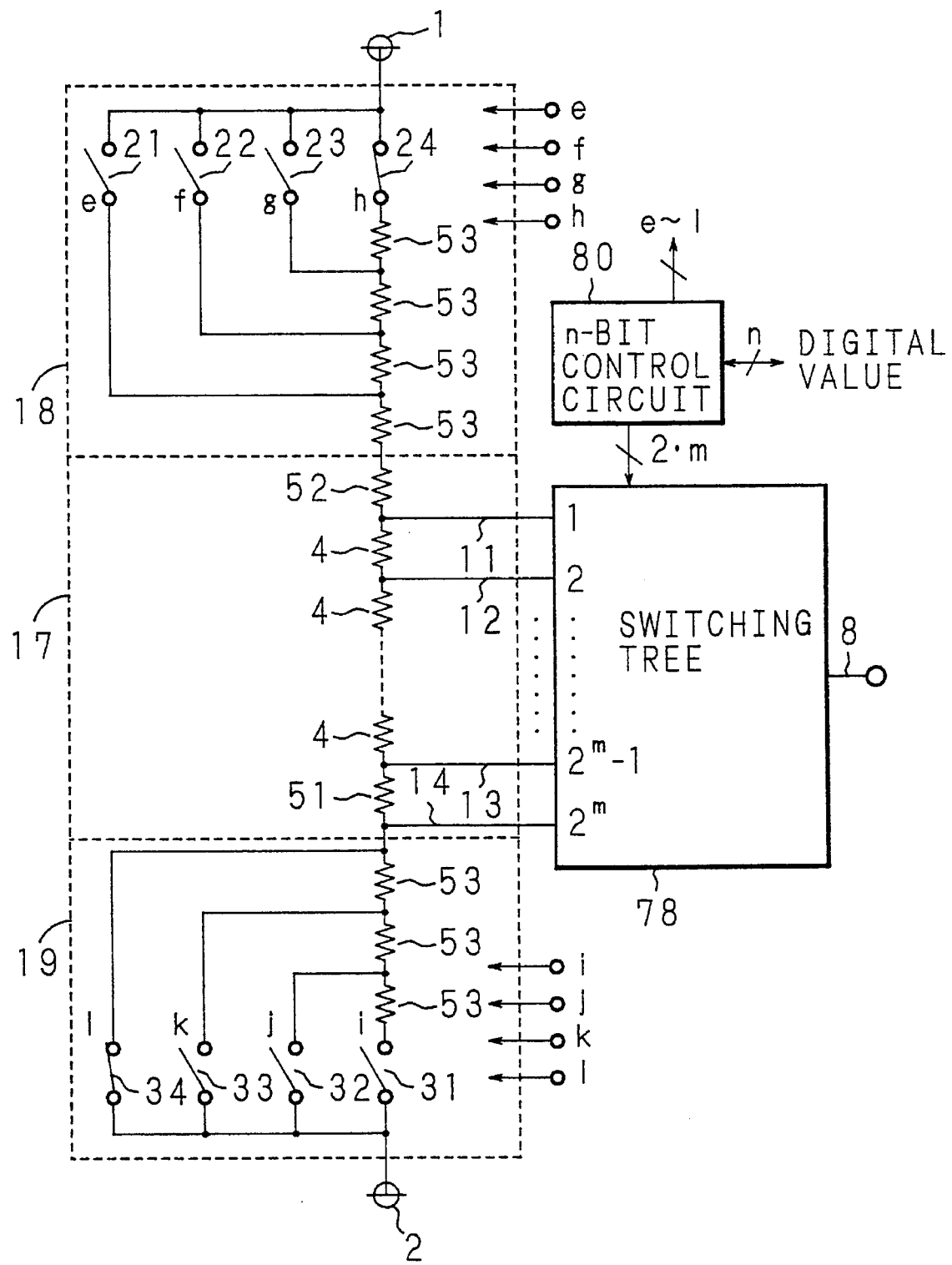
FIG. 4 is a circuit block diagram showing the configuration of an embodiment of a resistance ladder of the invention, and a D-A converter of Embodiment 1 using the resistance ladder.

FIG. 4 is a circuit diagram showing the configuration of a D-A converter of n-bit resolution using a resistance ladder which is an embodiment of the invention. In the embodiment, n and m are set to be 6 and 4, respectively, and ½-LSB correction is not conducted. In the figure, numeral 1 designates a positive analog voltage source, and numeral 2 designates a negative analog voltage source. A resistance ladder consisting of three resistance groups 17, 18 and 19 is connected between the positive and negative analog voltage sources 1 and 2. In the D-A converter of the embodiment, higher-order m bits of the n bits are converted into an analog value by the first central resistance group 17. Then, the connecting path between the positive and negative analog voltage sources which is formed in the conversion of the m bits is shifted in accordance with a value of the lower-order (n-m) bits [=(lowest-order 2 bits)], so that an analog voltage corresponding to the m bits is changed in $2^{n-m}$ levels to output an analog voltage corresponding to the digital value of the n bits.

The first resistance group 17 comprises ($2^m$-2) [=14] resistors 4 connected in series, each of which has a resistance of R. A resistor 51 is connected to one end of the series circuit of the resistors 4 at the side of the negative analog voltage source 2, and a resistor 52 is connected to the other end at the side of the positive analog voltage source 1. The two resistors 51 and 52 are used to divide the resistance R in two. Without ½-LSB correction conducted in the embodiment, the resistor 51 has the resistance R which is the same as that of the resistor 4, and the resistance of the resistor 52 is equal to 0 Ω because the resistor 51 has the same resistance as each resistor 4, resulting in the total sum of the resistances of ($2^m$-1)·R. Ladder taps 11, . . . , 14 are connected to the corresponding nodes of the resistors 4, 51, 52, and the end of the resistor 51 at the side of the negative analog voltage source 2. The total number of the ladder taps is $2^m$ [=16]. In the figure, only a part of the ladder taps 11 through 14 is shown.

The second resistance group 18 comprises $2^{n-m}$ [=4] resistors 53 each having a resistance of $R/2^{n-m}$ [=R/4] in series connection. One end of the string of the resistors 53, 53, . . . is connected to the resistor 52 of the first resistance group 17, and the other end is connected through connecting means 24 to the positive analog voltage source 1. Each node between the resistors 53 is connected through connecting means 21, 22, 23 to the positive analog voltage source 1.

The third resistance group 19 comprises ($2^{n-m}$-1) [=3] resistors 53 each of which has a resistance of $R/2^{n-m}$ [=R/4] in series connection. One end of the string of the resistors 53, 53, . . . is connected to the resistor 51 of the first resistance group 17, and the other end is connected through connecting means 31 to the negative analog voltage source 2. The nodes of the resistors 53 are connected through connecting means 32, 33 and 34 to the negative analog voltage source 2.

A switching tree 78 is connected to the $2^m$ [=16] ladder taps 11, . . . , 14 of the first resistance group 17 so as to selectively output one of the analog voltages as an analog output 8.

The on/off operations of the connecting means 21 through 24 of the second resistance group 18, and the connecting means 31 through 34 of the third resistance group 19 are controlled by control signals e to l supplied from an n-bit control circuit 80 which functions as the first control means mentioned earlier, so that one of the connecting means in each of the second and third resistance groups 18 and 19 assumes the connection state.

The n-bit control circuit 80 generates and supplies control signals for m bits to the switching tree 78 through 2·m control signal lines so that the digital value of high-order m bits is determined. The n-bit control circuit 80 generates also the control signals e to l to control the connecting means 21 through 24 for the positive analog voltage source 1, and the connecting means 31 through 34 for the negative analog voltage source 2.

Next, the analog conversion operation of the thus configured D-A converter will be described.

When a 6-bit digital value is to be subjected to an analog conversion, in order to convert the higher-order 4 bits of the 6 bits into an analog value, the n-bit control circuit 80 first makes the control signals h and l significant so that the connecting means 24 and 34 are set in the connection state. The n-bit control circuit 80 supplies a control signal corresponding to the digital value of the higher-order 4 bits to the switching tree 78 through the 2·m control signal lines, so that the applicable switches of the switching tree 78 are turned on, and the switching tree 78 selects one of the ladder taps 11, . . . , 14 of the first resistance group 17 from which an analog output corresponding to the digital value of the higher-order 4 bits is taken. When the switching tree 78 selects the ladder tap 13, the voltage of the ladder tap 13 is outputted as the analog output 8.

While the switching tree 78 is kept in the state to select the ladder tap 13, then, the n-bit control circuit 80 turns one of the control signals e through g and one of the control signals i through k significant, so that the connecting path between the positive and negative analog voltage sources 1 and 2 is formed by a combination of the connecting means 21 through 23 and 31 through 33 of the second and third resistance groups 18 and 19.

In other words, the connecting path between the positive and negative analog voltage sources 1 and 2 is formed as follows: when the digital value of the lower-order 2 bits is "00", the control signals h and l are made significant so that the connecting means 24 and 34 are set into the connection state; when the digital value is "01", the control signals g and k are made significant so that the connecting means 23 and 33 are set l to be connected; when the digital value is "10", the control signals f and j are made significant so that the connecting means 22 and 32 are set to be connected state; and when the digital value is "11", the control signals e and i are made significant so that the connecting means 21 and 31 are brought into the connection state.

The thus formed connecting path can provide 16 [$=2^m$] levels of division voltages across the positive and negative analog voltage sources 1 and 2 in which the analog output of the lowest ladder tap 15 is zero, under the connection state where 4 [$=2^{n-m}$] of resistors 53 of the second resistance group 18 are inserted between the first resistance group 17 and the positive analog voltage source 1, and the resistors 53 of the third resistance group 19 are not inserted between the first resistance group 17 and the negative analog voltage source 2. When 3 [$=(2^{n-m}-1)$] resistors are inserted between the first resistance group 17 and the positive analog voltage source 1, and one resistor is inserted between the first resistance group 17 and the negative analog voltage source 2, an analog output is obtained which is a sum of an analog voltage in the connection state where 4 resistors 53 are inserted between the first resistance group 17 and the positive analog voltage source 1, and a voltage which is $1/64[=1/2^n]$ times the potential difference between the positive and negative analog voltage sources 1 and 2. When 2 [$=(2^{n-m}-2)$] resistors are inserted between the first resistance group 17 and the positive analog voltage source 1, and 2 resistors are inserted between the first resistance group 17 and the negative analog voltage source 2, an analog output is obtained which is a sum of an analog voltage in the connection state where 4 resistors 53 are inserted between the first resistance group 17 and the positive analog voltage source 1, and a voltage which is 2/64 [$=2/2^n$] times the potential difference between the positive and negative analog voltage sources 1 and 2. In the case where 1 [$=(2^{n-m}-3)$] resistor is inserted between the first resistance group 17 and the positive analog voltage source 1, and 3 resistors are inserted between the first resistance group 17 and the negative analog voltage source 2, obtained is an analog output which is a sum of an analog voltage in the connection state where 4 resistors 53 are inserted between the first resistance group 17 and the positive analog voltage source 1, and a voltage which is 3/64 [$=3/2^n$] times the potential difference between the positive and negative analog voltage sources 1 and 2.

In other words, a voltage which is $1/2^6$ [$=1/2^n$] times the potential difference between the positive and negative analog voltage sources 1 and 2 is added to the voltage of the ladder tap 13 selected in accordance with the digital value of the higher-order 4 bits, thereby generating 4 [$=2^{n-m}$] levels of division voltages at the ladder tap 13.

Assuming that the potential difference between the positive and negative analog voltage sources 1 and 2 is 3.20 V, this potential difference is divided into 16 [$=2^m$] levels in the m-bit conversion, so that the potential difference between adjacent ladder taps is 200 mV. When the second lowest ladder tap 13 is selected at the completion of the m-bit conversion, therefore, the analog output 8 is 200 mV. In the analog conversion of the lower-order 2 bits, a voltage corresponding to the digital value of the lower-order 2 bits is added for every voltage [=50 mV] which is $1/2^6$ [$=1/2^n$] times the potential difference between the positive and negative analog voltage sources 1 and 2, to the voltage of 200 mV of the ladder tap 13 selected in the analog conversion of the higher-order 4 bits, thereby generating 4 [$=2^{n-m}$] levels of division voltages at the ladder tap 13.

In the above conversion, when the lower-order 2 bits are "01", the analog output 8 is 250 mV; when the lower-order 2 bits are "10", the analog output 8 is 300 mV; and when the lower-order 2 bits are "11", the analog output 8 is 350 mV.

Embodiment 2

Figure 5:
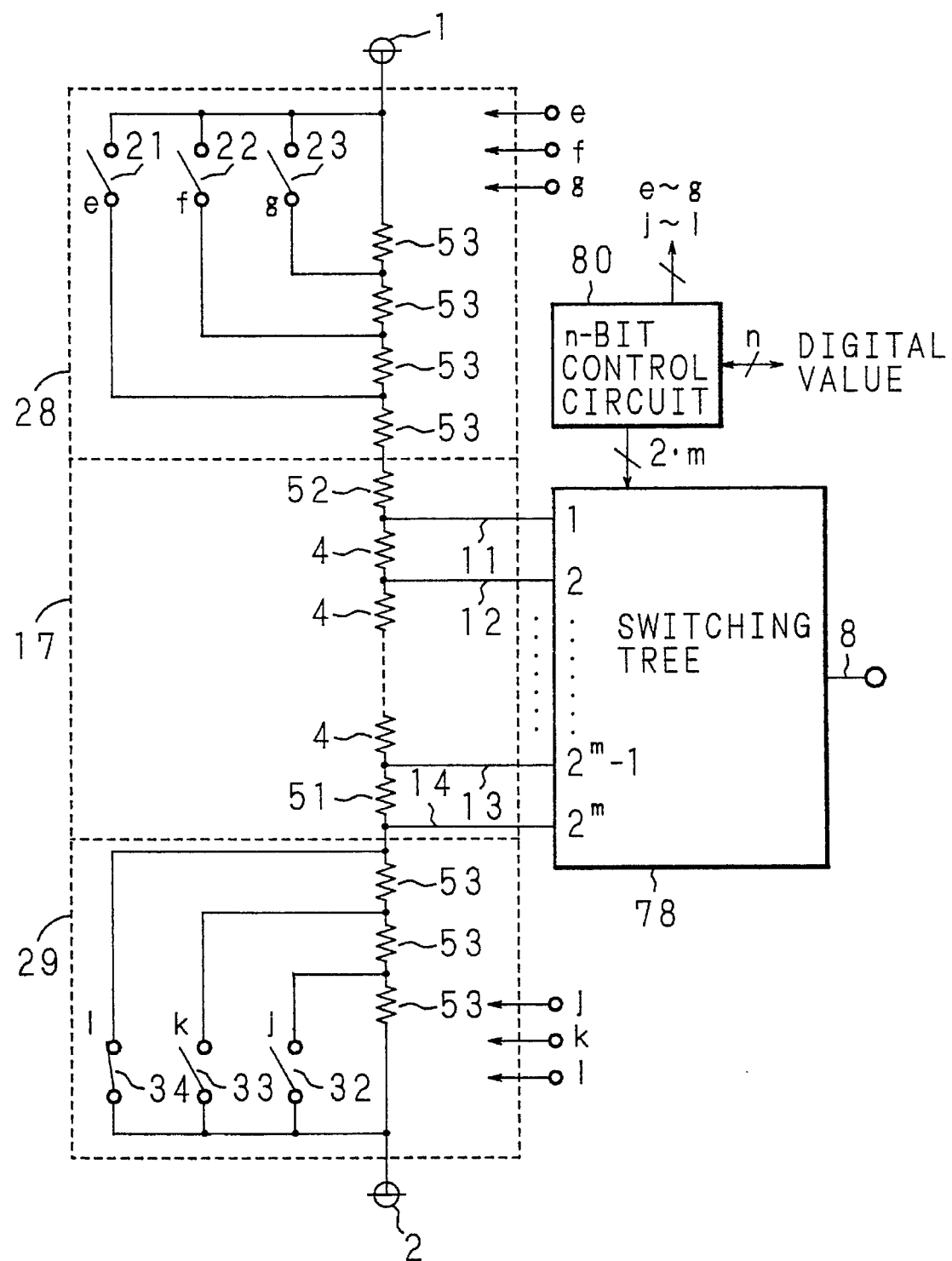
FIG. 5 is a circuit block diagram showing the configuration of another embodiment oF the resistance ladder of the invention, and the D-A converter of Embodiment 2 using the resistance ladder.

FIG. 5 is a circuit diagram showing the configuration of a D-A converter of n-bit resolution using a resistance ladder which is an embodiment of the invention. Also in the embodiment, in the same manner as in Embodiment 1, it is assumed that n and m are set to be 6 and 4, and ½·LSB correction is not conducted. The same portions as those of Embodiment 1 are designated by the same reference numerals, and their description is omitted. The embodiment is different from Embodiment 1 in that no connecting means is provided between one end of the string of resistors 53, 53, ... of a second resistance group 28 at the side of the positive analog voltage source 1, and the positive analog voltage source 1, and between one end of the string of resistors 53, 53, ... of a third resistance group 29 at the side of the negative analog voltage source 2, and the negative analog voltage source 2.

The D-A converter of the embodiment operates substantially in the same manner as that of Embodiment 1 except that the n-bit control circuit 80 forms the connecting path between the positive and negative analog voltage sources 1 and 2 as follows: in the conversion of m bits, the control signal l is made significant so as to set the connecting means 34 in the connection state; in the conversion of lower-order 2 bits, when the digital value of the lower-order 2 bits is "00", the control signal l is made significant so as to set the connecting means 34 to be in the connection state, and, when the digital value of the lower-order 2 bits is "11", the control signal e is made significant so as to set the connecting means 21 to be in the connection state.

A series resistance ladder in which all the first through third resistance groups 17, 28 and 29 are connected is always kept connected to the positive and negative analog voltage sources 1 and 2. Consequently, the connecting path between the positive and negative analog voltage sources 1 and 2 is selected in accordance with a combination of the connecting means 21 through 23 and 32 through 34. Since the connecting means 21 through 23 and 32 through 34 have a resistance lower than that of the resistor 53, the path in which all the resistance groups are always connected to the positive and negative analog voltage sources 1 and 2 has a resistance sufficiently higher than that of the connecting path formed by the combination of the connecting means, so that the resistance of the positive and negative analog voltage sources 1 and 2 depends on the connecting path selected by the combination of the connecting means 21 through 23 and 32 through 34. When a resistance ladder is given some degree of allowance for accuracy, the number of circuit elements used in the resistance ladder having the configuration of the embodiment can be reduced as compared to that used in the resistance ladder of Embodiment 1.

Embodiment 3

Figure 6:
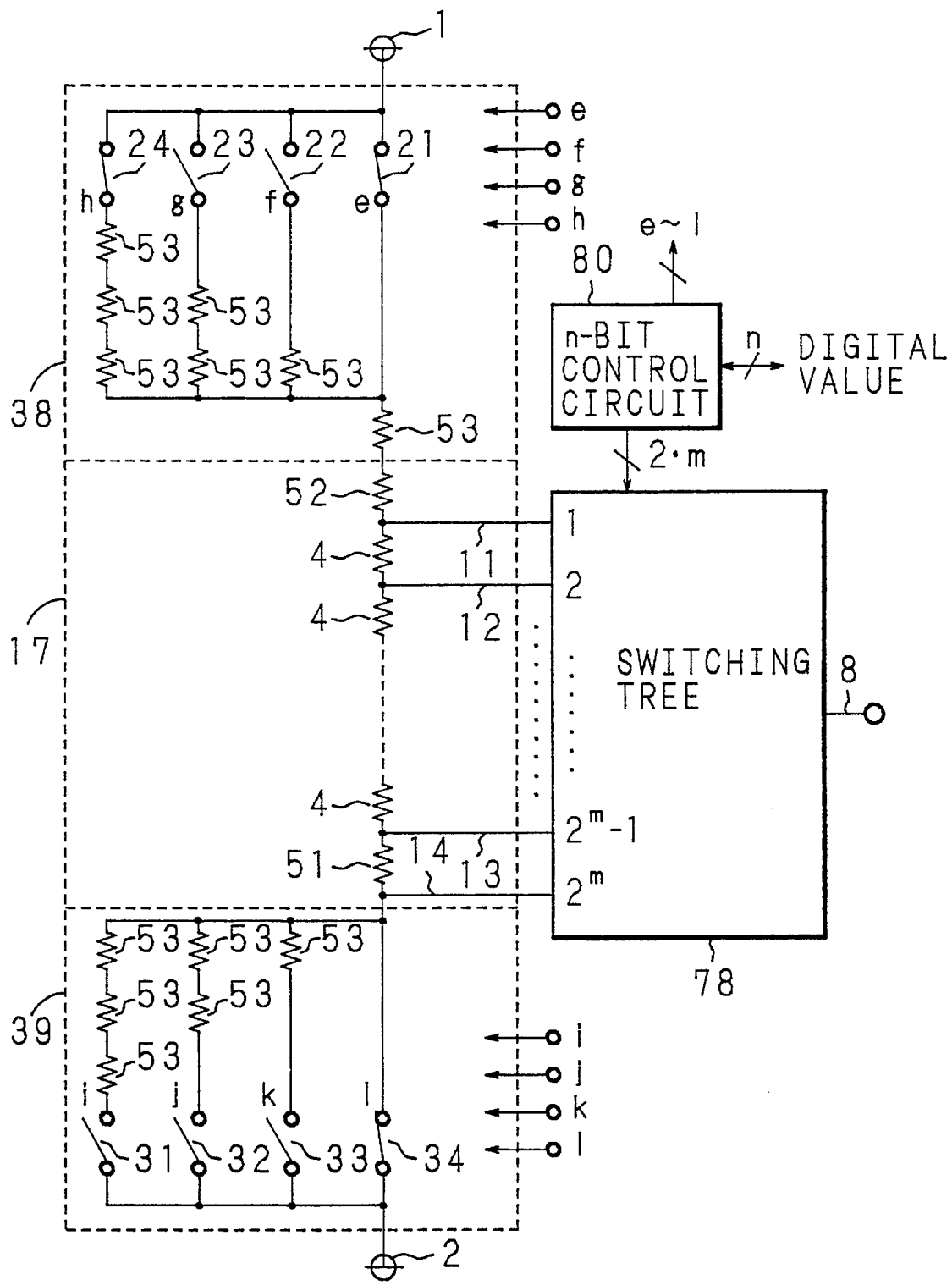
FIG. 6 is a circuit block diagram showing the configuration of a still another embodiment of the resistance ladder of the invention, and a D-A converter of Embodiment 3 using the resistance ladder.

FIG. 6 is a circuit diagram showing the configuration of a D-A converter of n-bit resolution using a resistance ladder which is an embodiment of the invention. Also in the embodiment, in the same manner as in Embodiment 1, it is assumed that n and m are set to be 6 and 4, and ½-LSB correction is not conducted. The same portions as those of Embodiment 1 are designated by the same reference numerals, and their description is omitted. The embodiment is different from Embodiment 1 in the configuration of second and third resistance groups 38 and 39. The embodiment operates in the same manner as in Embodiment 1, and therefore the description of the operation will be omitted.

The second resistance group 38 comprises 3 [=($2^{n-m}$-1)] strings of series resistors 53, and the connecting means 21 through 24 which selectively connect one end of each string of the series resistors in a separate manner, and the other ends of the strings of the resistors in common to the positive analog voltage source 1. In each string of the series resistors, resistors 53 each having a resistance of $R/2^{n-m}$ are connected in series, and the number of the resistors in the strings of the resistors sequentially decreases one by one from 3 [=($2^{n-m}$-1)] to 1. The other ends of the strings are connected in common to the first resistance group 17 through the resistor 53 having a resistance of $R/2^{n-m}$.

The third resistance group 39 comprises 3 [=($2^{n-m}$-1)] strings of series resistors, and the connecting means 31 through 34 which selectively connect one end of each string of the series resistors individually, and the other ends of the strings in common to the negative analog voltage source 2. In each string of the series resistors, resistors each having a resistance of $R/2^{n-m}$ are connected in series, and the number of the resistors in the strings of the resistors sequentially decreases by one from 3 [=($2^{n-m}$-1)] to 1. The other ends of the strings of the resistors are connected in common to the first resistance group 17.

In Embodiments 1 through 3 described above, it is assumed that the connecting means 21 through 24 and 31 through 34 between the positive and negative analog voltage sources 1 and 2 have no resistance component. In the fabrication of an LSI, these connecting means are mainly constituted of MOSFETs. Generally, the specific resistance between the source and drain of the MOSFET is preliminarily known in the state of design. Therefore, if the specific resistance of the transistor is removed beforehand from the resistance of each resistor 51, 52 and/or 53 at both ends of the first resistance group, an error in the linearity due to the specific resistance of the transistors is theoretically eliminated.

From an idealistic view point, the connecting means 21 through 24 and 31 through 34 are designed so as to have the same resistance which is very low and at least lower than that of the resistor 53. This allows all analog voltages generated by the resistance ladder of the invention to show an excellent linearity.

The analog output may sometimes be requested to have the voltage equal to that of the positive analog voltage source 1. In such a case, the voltage equal to that of the positive analog voltage source 1 can easily be attained by setting all the connecting means 31 through 34 to the negative analog voltage source 2 into the disconnection state. Similarly, when the analog output is requested to have the voltage equal to that of the negative analog voltage source 2, such a voltage can easily be obtained by setting all the connecting means 21 through 24 to the positive analog voltage source 1 in the disconnection state.

Embodiment 4

Figure 7:
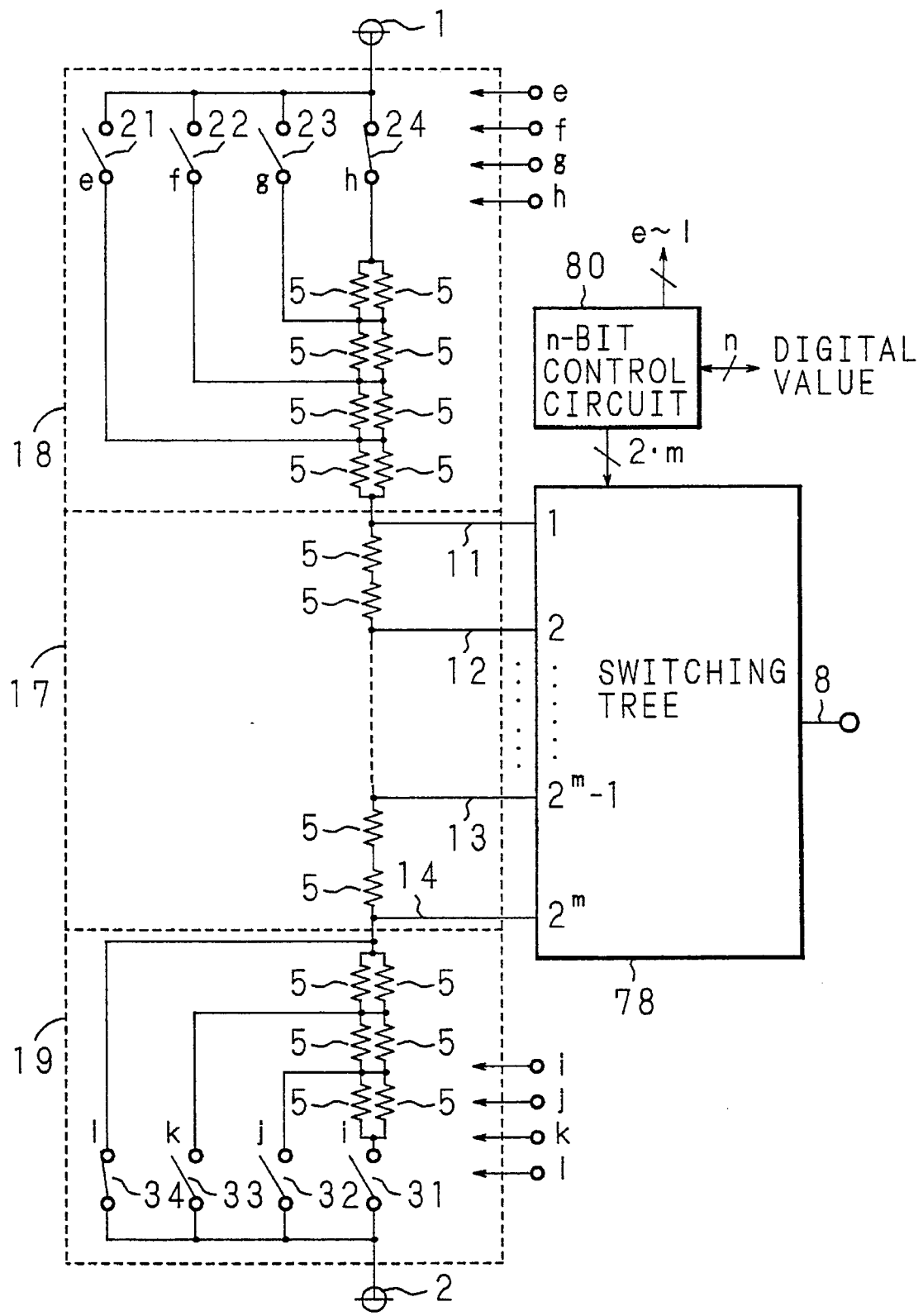
FIG. 7 is a circuit block diagram showing the configuration of a further embodiment of the resistance ladder of the invention, and a D-A converter of Embodiment 4 using the resistance ladder.

FIG. 7 is a circuit diagram showing the configuration of a D-A converter of n-bit resolution using a resistance ladder which is an embodiment of the invention. Also in the embodiment, in the same manner as in Embodiment 1, it is assumed that n and m are set to be 6 and 4, and ½-LSB correction is not conducted. The same portions as those of Embodiment 1 are designated by the same reference numerals, and their description is omitted. The embodiment is different from Embodiment 1 in that the first resistance group 17 comprises $2 \cdot (2^m-1)$ unit resistors 5, each unit resistor having a resistance of R/2, in series connection, $2^m$ ladder taps 11, . . . , 14 are connected to the both ends of the series resistors 5, 5, . . . , and to the nodes of the series circuits each consisting of two unit resistors 5, and the second and third resistance groups 18 and 19 consist of parallel circuits each of $2 [=2^{n-m/2}]$ unit resistors 5, each unit resistor having a resistance of R/2 so that every parallel circuit of two unit resistors realizes a resistance of $R/2^{n-m}$.

When resistors are to be formed in a production process of LSIs, the resistors are varied in the width of each resistance body, the size of through holes connecting the resistor to conductors, the distance between the through holes, the contact resistance, etc. As far as these values are irregular on the same chip, it influences little on the division voltages generated by a resistance ladder. Therefore, the resistance ladder may be configured by using resistors each having the minimum resistance as the unit resistors. For instance, when the whole of the resistance ladder in Embodiment 1 is designed by using the resistors 53 which have the minimum resistance as the unit resistor, each of the resistors 4 is formed either by connecting 4 resistors 53 in series, or by setting the width to be ¼ the original. In the former case, even when the resistors 53 occupy a small area, each resistor requires a through hole to be connected to the conductor, and hence the area of the first resistance group 17 is increased although the second and third resistance groups 18 and 19 can be accommodated in a small area. In the case of reducing the resistor width to one fourth, even the variation on the same chip is of a large proportion to the width, making it difficult to obtain products of stable properties.

In view of the above, according to the embodiment, the unit resistor of the minimum resistance are designed to have a resistance of R/2, and the resistors 5 are connected in parallel to obtain a resistor having a resistance of $R/2^{n-m}$, whereby a resistance ladder of higher accuracy is configured.

Embodiment 5

Figure 8:
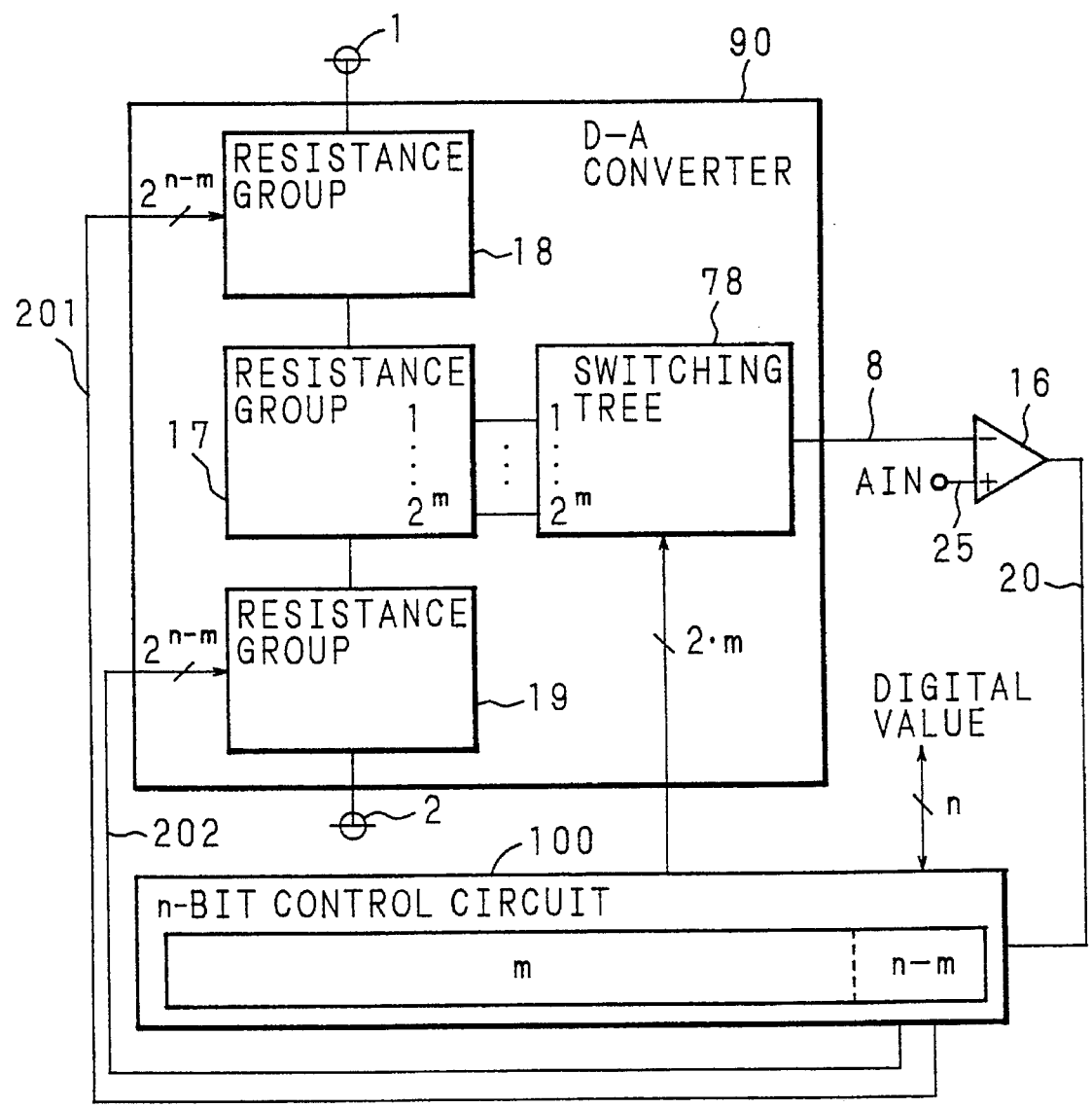
FIG. 8 is a circuit block diagram showing the configuration of Embodiment 5 of an A-D converter using the D-A converter of the invention.

FIG. 8 is a circuit block diagram showing the configuration of a sequential approximation type A-D converter using any one of the D-A converters of Embodiments 1 through 4. Also in the embodiment, in the same manner as in Embodiment 1, it is assumed that n and m are set to be 6 and 4, and ½-LSB correction is not conducted. The same portions as those of Embodiment 1 are designated by the same reference numerals, and their description is omitted.

In the figure, 90 designates one of the D-A converters of Embodiments 1 through 4. An n-bit control circuit 100 which functions as the first and second control means operates as follows: Control signals 201 and 202 for setting the second and third resistance groups 18 and 19 to be in the connection state or the disconnection state are supplied to the D-A converter 90 through respective $2^{n-m}$ signal lines. The connecting means (the connecting means 24 and 34 of FIGS. 4 and 6 or the connecting means 34 of FIG. 5) of the second and third resistance groups 18 and 19 are selectively set to be in the connection state, so that a connecting path to the positive and negative analog voltage sources 1 and 2 is formed to establish a resistance of $2^m \cdot R$ between the positive and negative analog voltage sources 1 and 2. The analog output 8 from the D-A converter 90 is obtained by sequentially setting a virtual or provisional digital value from the highest of the m bits of the n bits. The digital value of the high-order m bits is sequentially determined by using the sequential approximation method on the basis of a comparison result signal 20 obtained by comparing the analog output 8 with an analog input 25 supplied from outside through the input terminal AIN.

Furthermore, the n-bit control circuit 100 operates as follows: While the ladder tap outputting an analog voltage corresponding to the digital value of m bits selected in the m bit conversion remains selected, the control signals 201 and 202 corresponding to a provisional value of the digital value set to the low-order (n-m) bits of the n bits are supplied to the D-A converter 90. The connecting means of the second and third resistance groups 18 and 19 are selectively connected, so that the connecting path between the positive and negative analog voltage sources 1 and 2 is changed, whereby the analog voltage outputted from the ladder tap of the first resistance group 17 is changed at least (n-m) times. Successively, the analog output 8 from the D-A converter 90 is compared with the analog input 25 and the digital value of low-order (n-m) bits is determined by using the sequential approximation method.

Figure 9A:
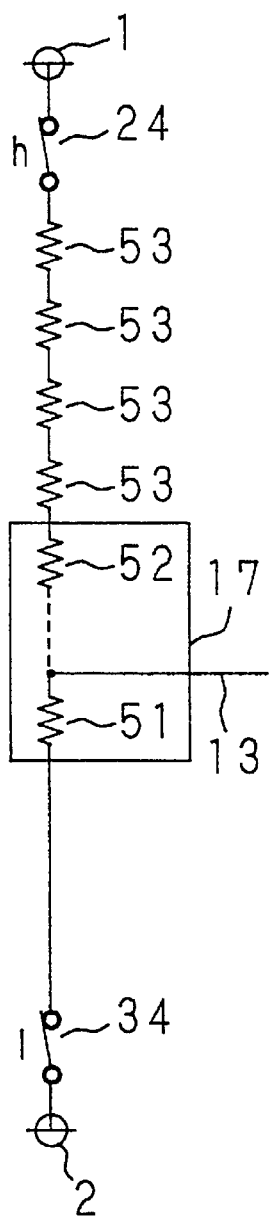
FIG. 9A is a diagram of the transition of the connection state of the resistance ladder illustrating the digital conversion operation of the A-D converter of FIG. 8.
Figure 9B:
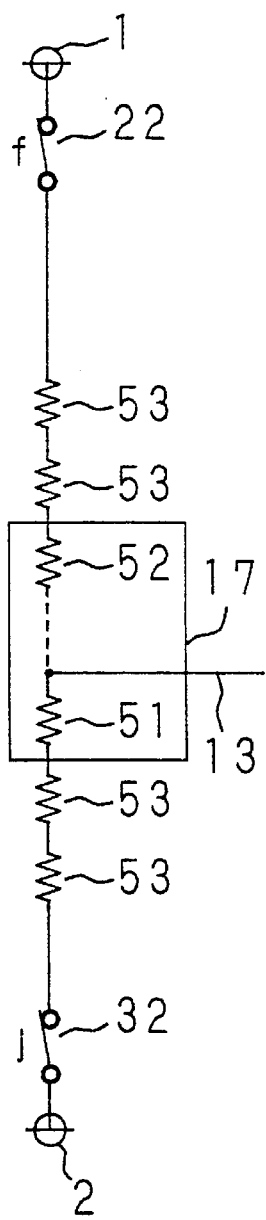
FIG. 9B is a diagram of the transition of the connection state of the resistance ladder illustrating the digital conversion operation of the A-D converter of FIG. 8.
Figure 9C:
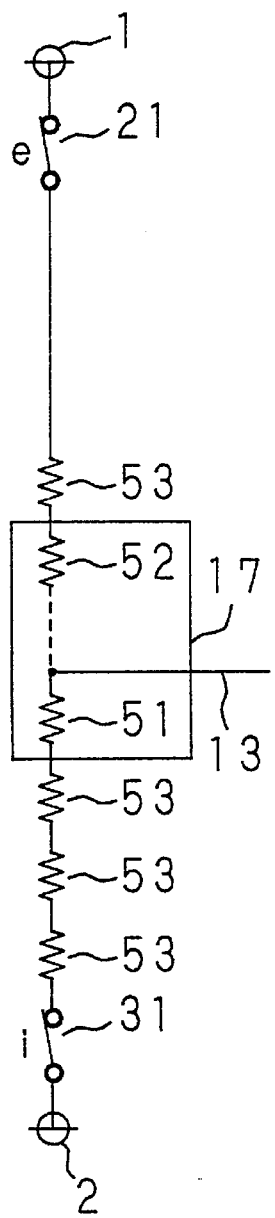
FIG. 9C is a diagram of the transition of the connection state transition of the resistance ladder illustrating the digital conversion operation of the A-D converter of FIG. 8.
Figure 10:
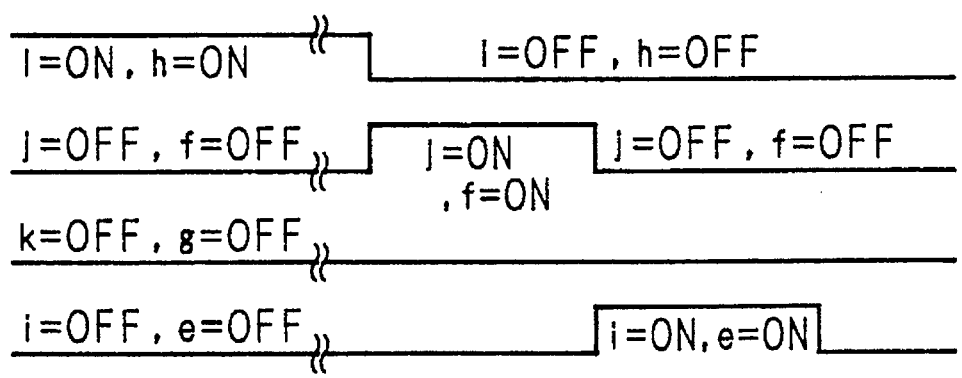
FIG. 10 is a timing chart of control signals by which the state transition shown in FIG. 9 is attained.
Figure 10:
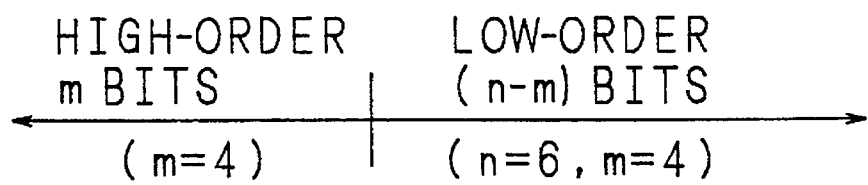
Figure 11A:
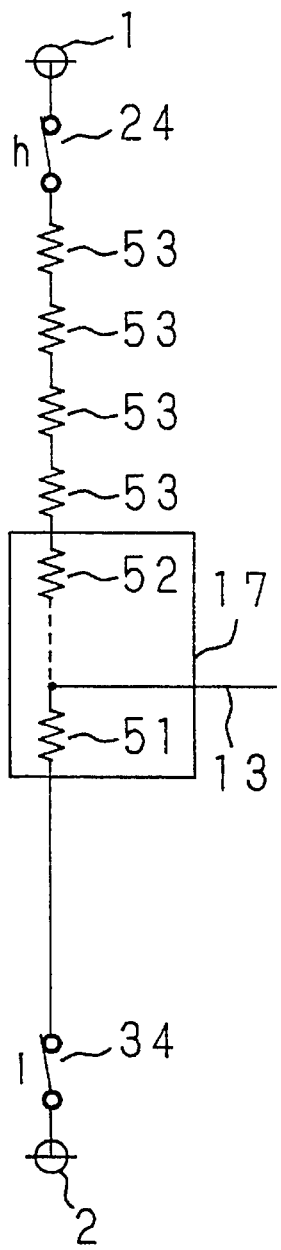
FIG. 11A is a diagram of the transition of the connection state of the resistance ladder illustrating the digital conversion operation of the A-D converter of FIG. 8.
Figure 11B:
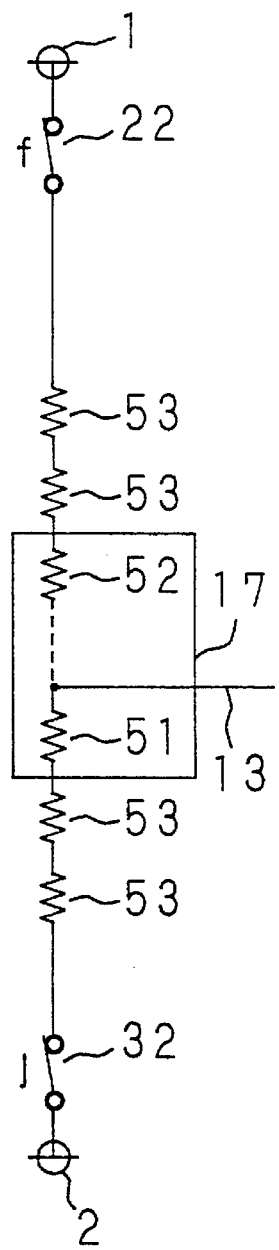
FIG. 11B is a diagram of the transition of the connection state of the resistance ladder illustrating the digital conversion operation of the A-D converter of FIG. 8.
Figure 11C:
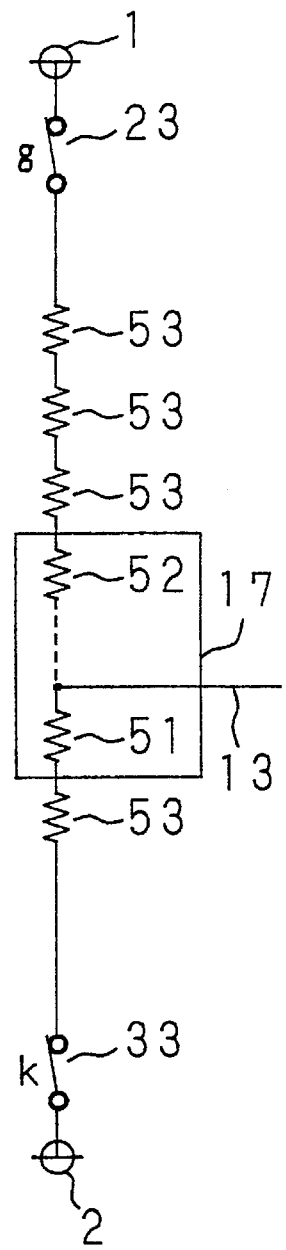
FIG. 11C is a diagram of the transition of the connection state of the resistance ladder illustrating the digital conversion operation of the A-D converter of FIG. 8.
Figure 12:
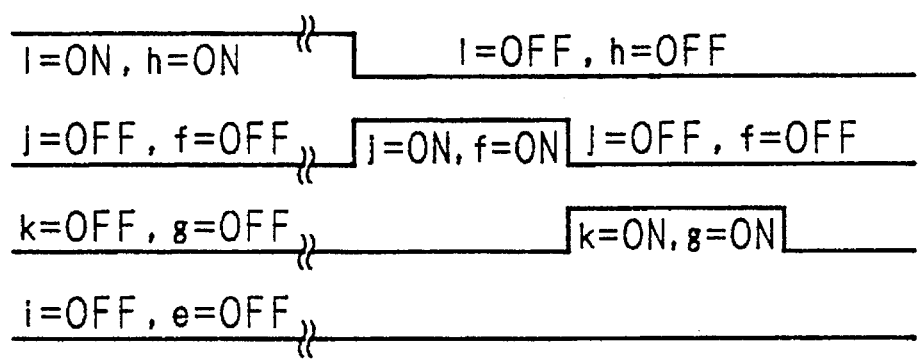
FIG. 12 is a timing chart of control signals by which the state transition shown in FIG. 11 is attained.
Figure 12:
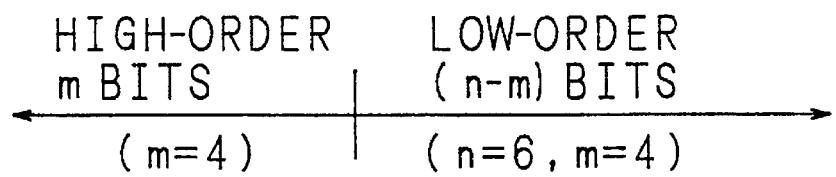

Next, the digital conversion operation of the thus configured A-D converter will be described with reference to FIGS. 9 through 12. FIGS. 9 and 11 are diagrams of the transition of the connection state of the resistance ladder of one of Embodiments 1, 3 and 4 in which the connection/disconnection of the connecting means is controlled by the control signals e through l. FIGS. 10 and 12 are timing charts of the control signals e through l by which the state transition shown in FIGS. 9 and 11 is attained.

Figure 1:
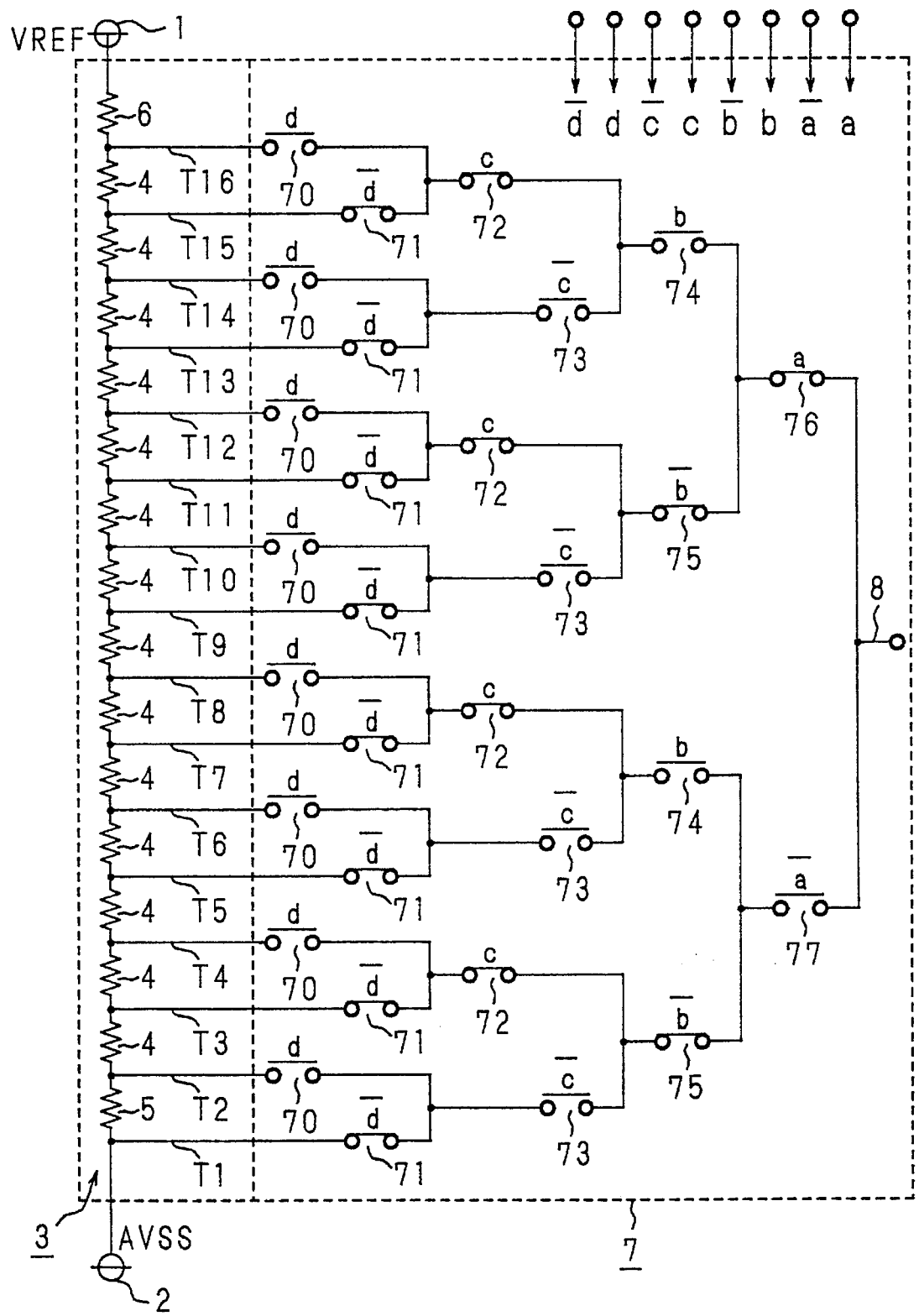
FIG. 1 is a circuit diagram showing the configuration of a prior art resistance ladder of 4-bit resolution.
Figure 2:
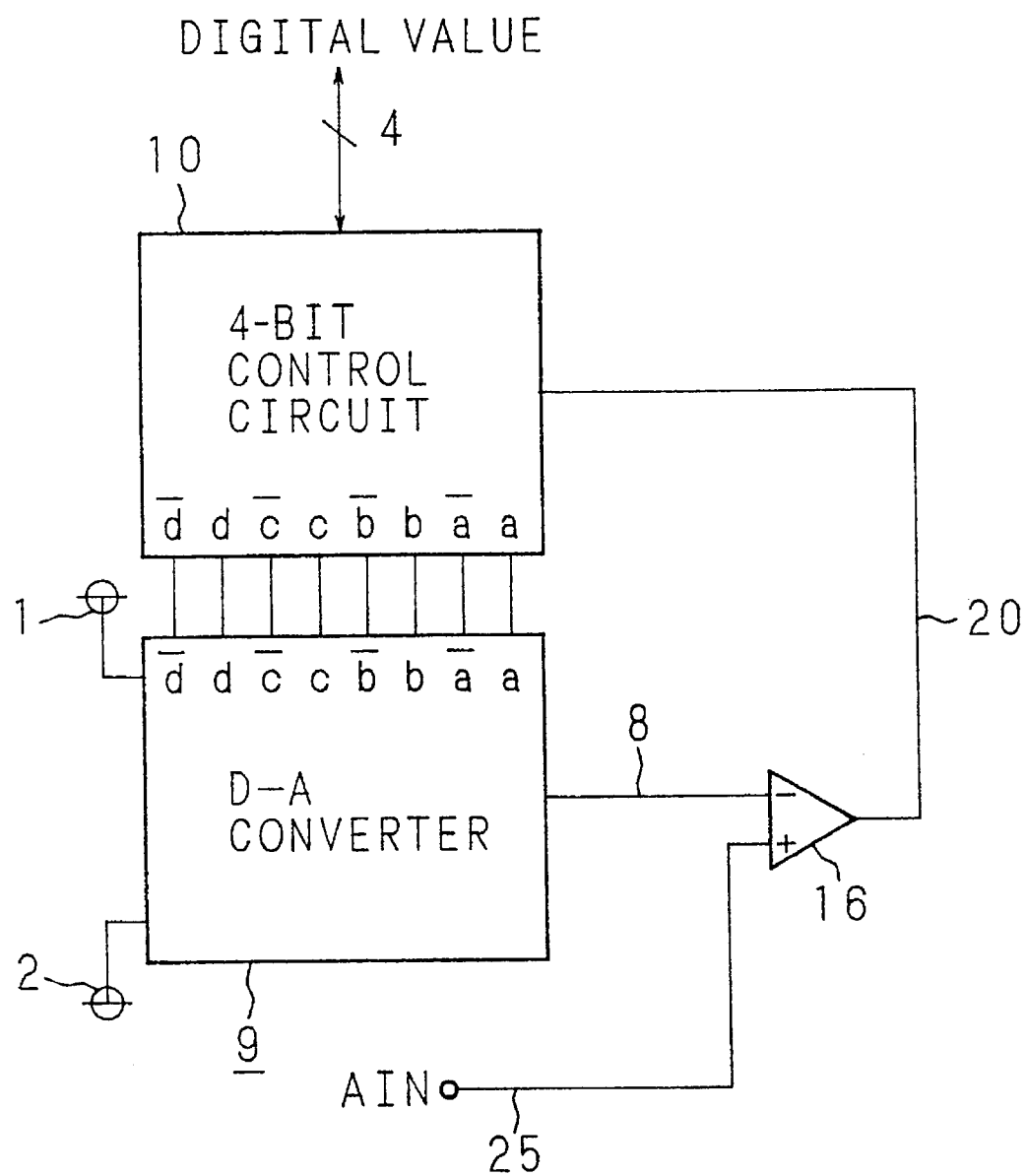
FIG. 2 is a circuit block diagram showing the configuration of a prior art A-D converter.
Figure 3:
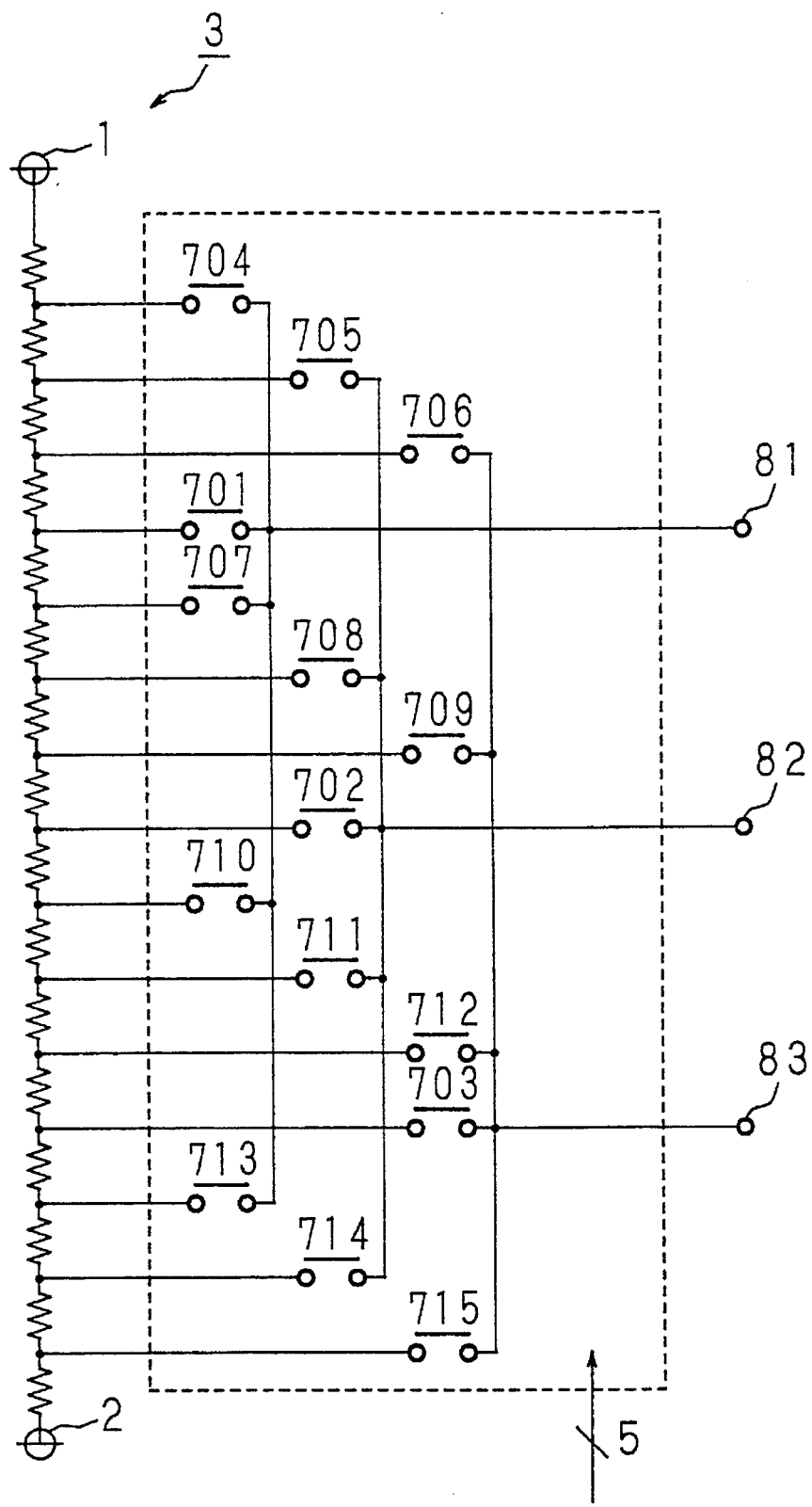
FIG. 3 is a circuit diagram showing the configuration of main portions of another prior art A-D converter.

When, according to the conversion result of a fourth bit at the completion of the digit conversion of higher-order 4 bits, the ladder tap 13 shown in FIGS. 1, 6 and 7 is selected as the most approximate one to the analog input 25, for example, an analog voltage corresponding to a digital value "$00010_2$" is outputted from the analog output 8. In the case where the potential difference between the positive and negative analog voltage sources 1 and 2 is 3.2 V, the analog output 8 has a voltage of 200 mV.

In the A-D conversion of a fifth bit, the digital value is provisionally set to be "$000110_2$". While the ladder tap selected in the conversion of the fourth bit remains connected to a comparator 16, the connecting means 24 and 34 connecting the resistance ladder to the positive and negative analog voltage sources 1 and 2 in the A-D conversion up to the fourth bit are disconnected, and instead the connecting means 22 and 32 are turned into the connection state, thereby connecting the positive and negative analog voltage sources 1 and 2 to the resistance ladder. In this case, as compared to the state (FIGS. 9A and 11A) attained at the completion of the conversion of the fourth bit, 2 resistors 53 are inserted at the side of the negative analog voltage source 2, and simultaneously two resistors 53 ape reduced at the side of the positive analog voltage source 1 (FIGS. 9B and 11B), resulting in that the voltage of the ladder tap 13 is 300 mV. The comparator 16 compares the analog output 8 from the ladder tap 13 at this time with the analog input 25. When the result of the comparison between the analog output 8 and the analog input 25 shows that the analog input 25 is higher in voltage, the fifth bit is determined to be "1", whereas when the analog output 8 is higher, the Fifth bit is determined to be "0".

When the comparison of the fifth bit results in that the analog input 25 is higher in voltage than the analog output 8, the digital value is provisionally set to be "$00011_2$", and the process proceeds to the conversion of a sixth bit. The connecting means 22 and 32 connecting the resistance ladder to the positive and negative analog voltage sources 1 and 2 in the A-D conversion of the fifth and preceding bits are disconnected, and the connecting means 21 and 31 are set to be in the connection state, thereby connecting the positive and negative analog voltage sources 1 and 2 to the resistance ladder. In this case, as compared to the state (FIG. 9A) attained at the completion of the conversion of the fourth bit, 3 resistors 53 are reduced at the side of the positive analog voltage source 1, and three resistors are inserted at the side of the negative analog voltage source 2 (FIG. 9C). Therefore, the voltage at the ladder tap 13 is 350 mV. The comparator 16 compares the analog output 8 from the ladder tap 13 at this time with the analog input 25. When the result of the comparison between the analog output 8 and the analog input 25 shows that the voltage of the analog input 25 is higher, the sixth bit is determined to be "1", so that the digital value of the 6 bits corresponding to the analog input 25 reads "$000111_2$", and, when the analog output 8 is higher, the sixth bit is determined to be "0", so that the digital value of the 6 bits corresponding to the analog input 25 reads "$000110_2$".

In contrast, when the comparison of the fifth bit results in that the analog input 25 is lower in voltage than the analog output 8, the digital value is provisionally set to be "$000101_2$", and the process proceeds to the conversion of the sixth bit. The connecting means 22 and 32 through which the resistance ladder is connected to the positive and negative analog voltage sources 1 and 2 in the A-D conversion of the fifth and preceding bits are disconnected, and the connecting means 23 and 33 are set into the connection state, thereby connecting the positive and negative analog voltage sources 1 and 2 to the resistance ladder. In this case, as compared to the state (FIG. 11A) attained at the completion of the conversion of the fourth bit, 1 resistor 53 is reduced at the side of the positive analog voltage source 1, and 1 resistor 53 is inserted at the side of the negative analog voltage source 2 (FIG. 11C). Therefore, the voltage of the ladder tap 13 is 250 mV. The comparator 16 compares in voltage the analog output 8 from the ladder tap 13 at this time with the analog input 25. When the result of the comparison between the analog output 8 and the analog input 25 shows that the voltage of the analog input 25 is higher, the sixth bit is determined to be "1", so that the digital value of the 6 bits corresponding to the analog input 25 reads "$000101_2$", and, when the analog output 8 is higher, the sixth bit is determined to be "0", so that the digital value of the 6 bits corresponding to the analog input 25 reads "$000100_2$".

Figure 13A:
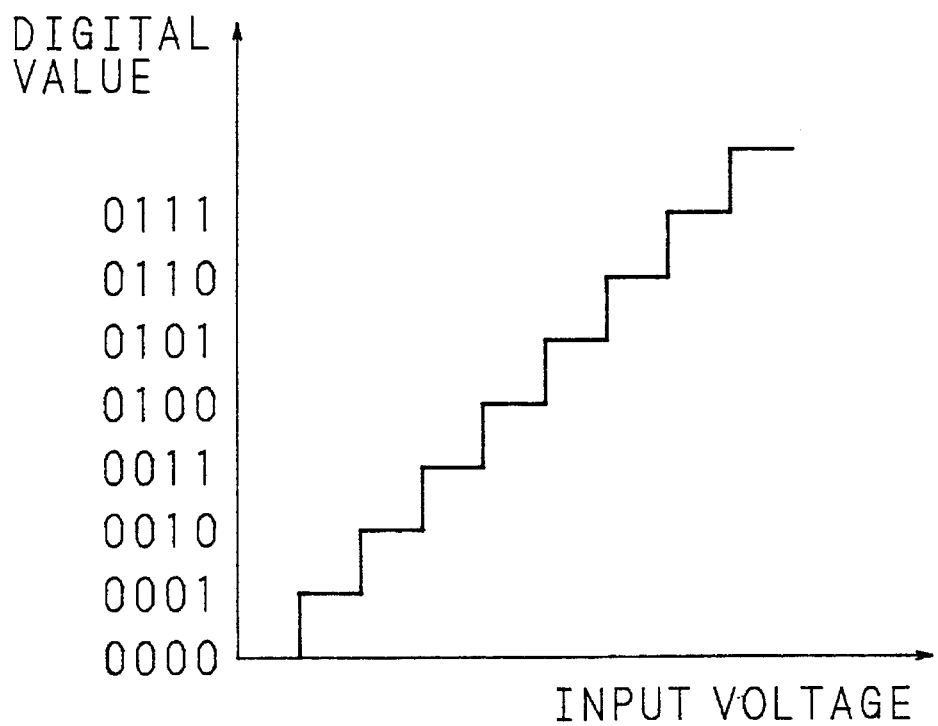
FIG. 13A is a diagram showing the conversion characteristic or quality of a prior art A-D converter in which ½-LSB correction is not conducted.
Figure 13B:
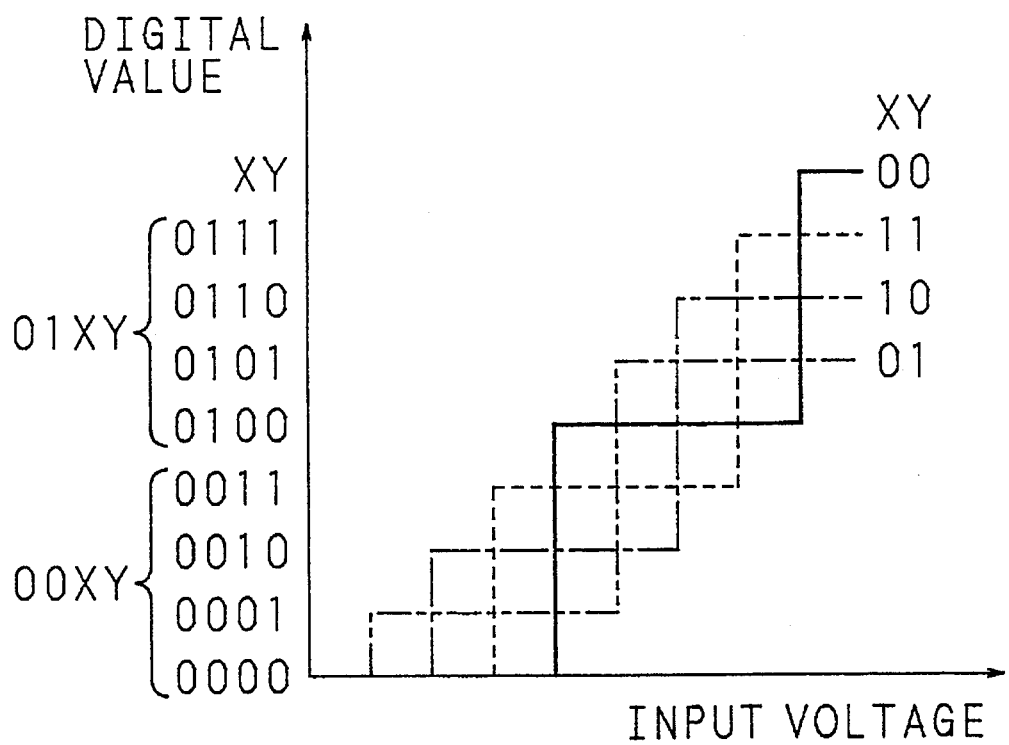
FIG. 13B is a diagram showing the conversion characteristic or quality of the A-D converter of the invention in which ½-LSB correction is not conducted.

Next, the conversion quality of the A-D converter of the invention will be described. FIG. 13A is a diagram showing the conversion quality of a prior art A-D converter of n-bit resolution, and FIG. 13B is a diagram showing the conversion quality of the A-D converter of n-bit resolution of the invention. These figures show the conversion quality to lower-order 3 bits. FIG. 13B shows respective states after the digital conversion of an analog output corresponding to higher-order m bits in the A-D converter of the invention to the third lowest bit (the conversion quality of this process is indicated by a solid line), and wherein the conversion quality is shifted after the digital conversion depending on the digital value of the low-order (n-m) bits [=2 bits] (indicated by a broken, one-dot chain line, and a two-dot chain line). As seen also from the figures, where the conversion quality is changed coincides with that of the prior art shown in FIG. 13A. This means that the A-D converter of the invention with a reduced number of elements can attain the conversion quality equivalent to that attained by an A-D converter of n-bit resolution of the prior art.

Embodiment 6

Figure 14:
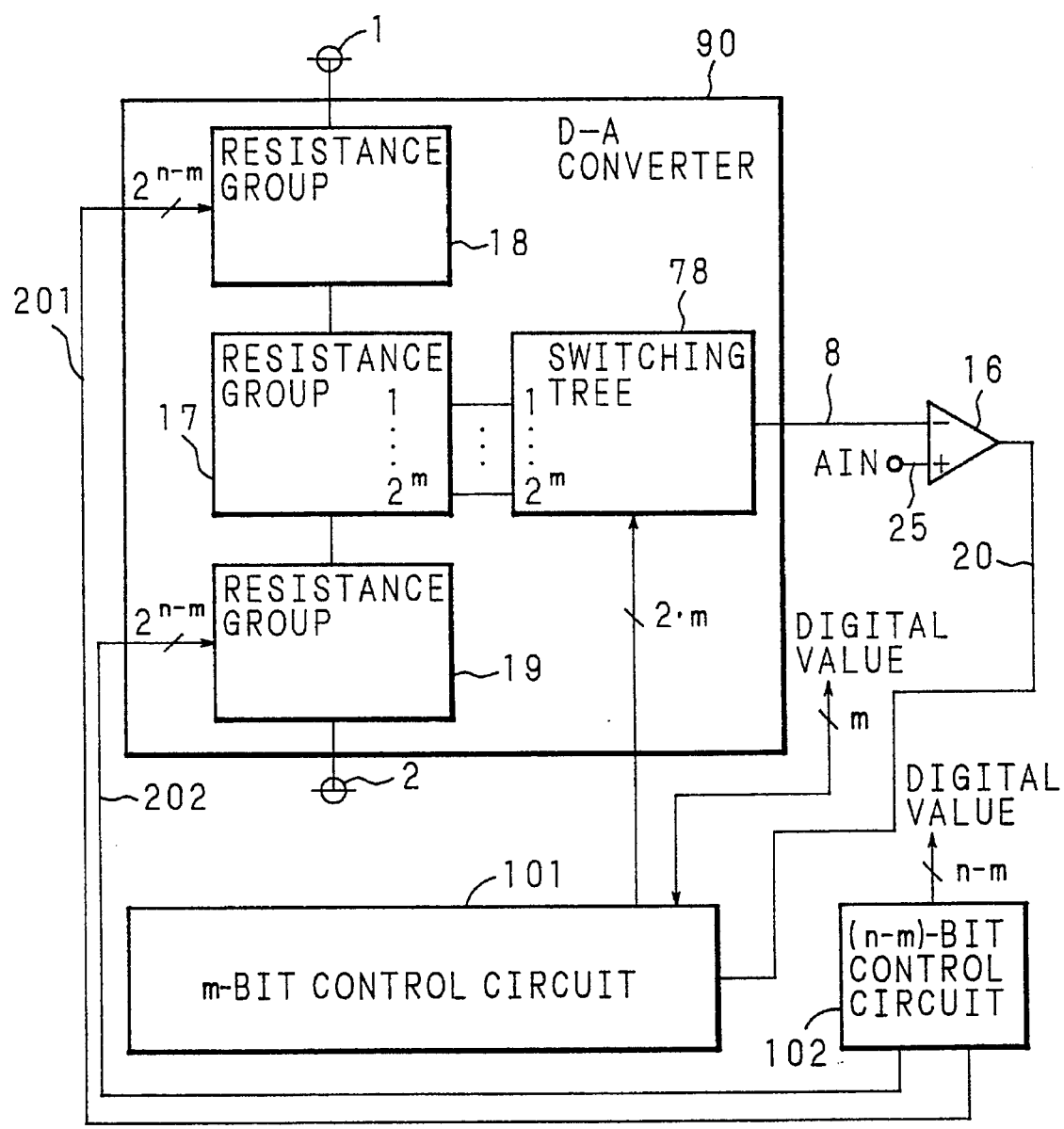
FIG. 14 is a circuit block diagram showing the configuration of an A-D converter of Embodiment 6 using the D-A converter of the invention.

FIG. 14 is a circuit block diagram showing the configuration of a sequential approximation type A-D converter using any one of the D-A converters of Embodiments 1 through 4. Also in the embodiment, in the same manner as in Embodiment 1, it is assumed that n and m are set to be 6 and 4. The same portions as those of Embodiment 1 or 5 are designated by the same reference numerals, and their description is omitted. According to the A-D converter of the embodiment, for example, when an analog input to which an offset within 1 LSB may be added is to be subjected to a digital conversion, an offset within 1 LSB is added beforehand to the D-A converter outputting a reference analog voltage to be compared with an external analog input, thereby eliminating an offset from a result of an A-D conversion.

The embodiment is different from Embodiment 5 in that, when the connecting path between the positive and negative analog voltage sources 1 and 2 is formed in an initial stage of the conversion by combining the connecting means of the second and third resistance groups 18 and 19, an (n-m)-bit control circuit 102 which conducts a part of the functions of the third and fourth control means forms a connecting path through which an offset for every $\frac{1}{2}^n$ the potential difference between the positive and negative analog voltage sources 1 and 2 is previously applied to the output of the D-A converter 90. More specifically, the (n-m)-bit control circuit 102 combines the connecting means to form a connecting path through which an offset is applied to the analog voltage from the ladder tap so that the output from the $2^m$th ladder tap outputting the lowest among the $2^m$ levels of analog voltages is higher than zero. That is, the case of the resistance ladder of Embodiment 1, 3 or 4, the connecting path is formed by combining the connecting means 21 through 23 and 31 and 33, and, in the case of the resistance ladder of Embodiment 2, the connecting path by combining the connecting means 21 through 23 and 32 and 34.

An m-bit control circuit 101 which conducts together with the (n-m)-bit control circuit 102 a part of the functions of the third and fourth control means supplies control signals for m bits to the D-A converter 90 having the connecting path formed as described above, and conducts the digital conversion on m bits by using the sequential approximation method in the same procedure as that of Embodiment 5.

Embodiment 7

Figure 15:
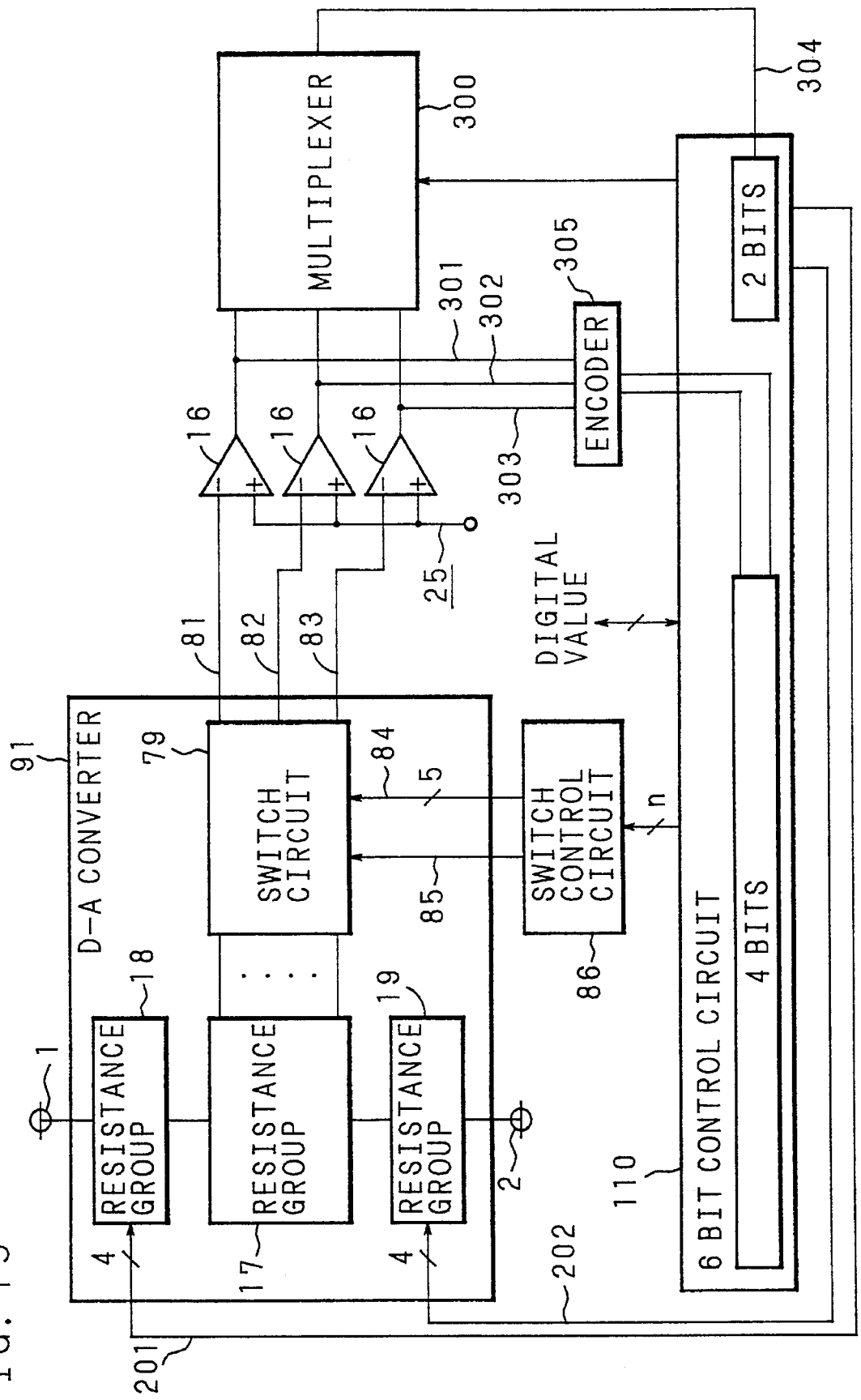
FIG. 15 is a circuit block diagram showing the configuration of an A-D converter of Embodiment 7 using the resistance ladder of the invention.
Figure 16:
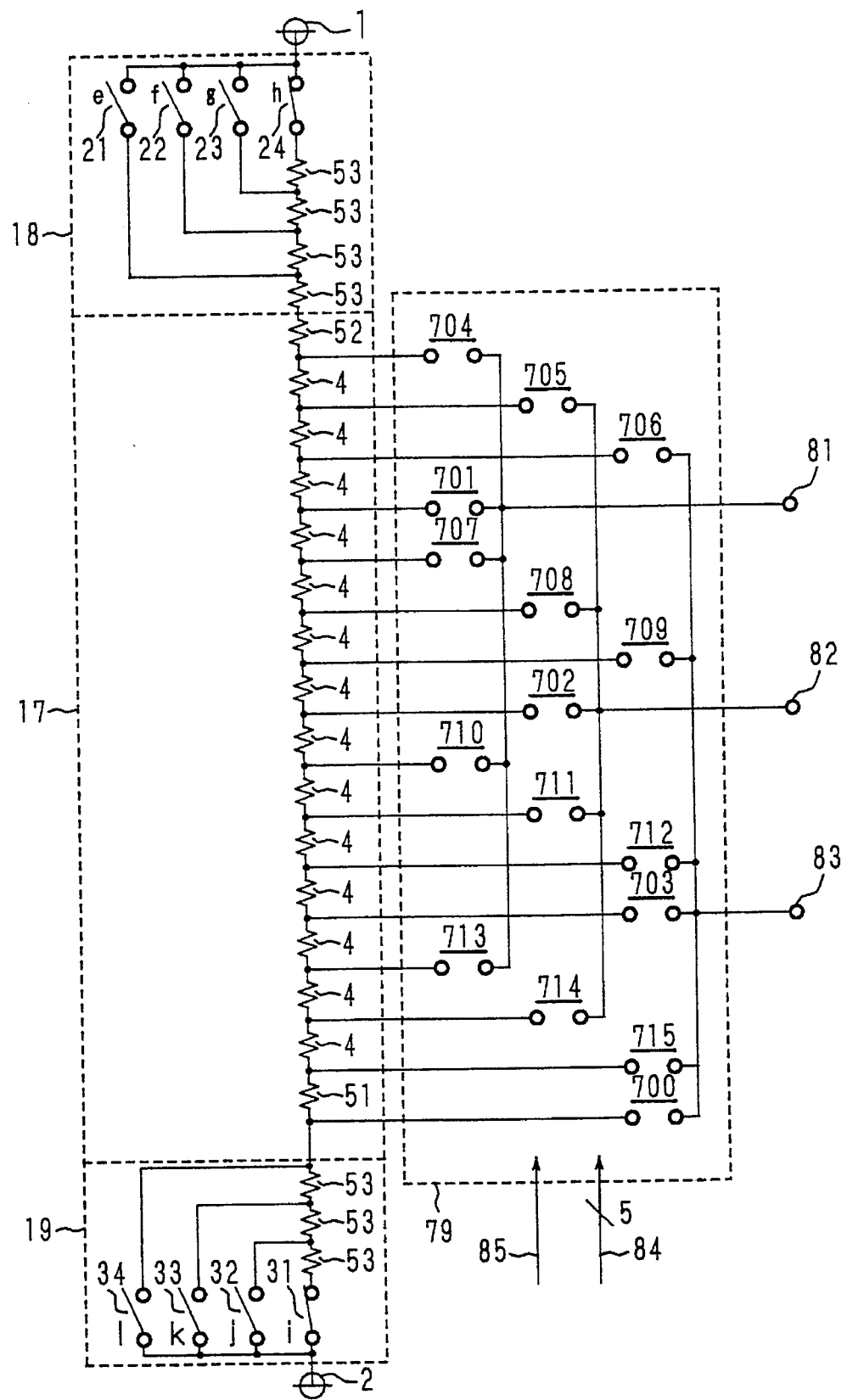
FIG. 16 is a circuit diagram showing in detail the configuration of a part of the A-D converter of FIG. 15.

FIG. 15 is a circuit block diagram showing the configuration of an A-D converter using a resistance ladder which is an embodiment of the invention, and FIG. 16 is a circuit diagram showing in detail the configuration of a part of the A-D converter of FIG. 15. Also in the embodiment, in the same manner as in Embodiment 1, it is assumed that n and m are set to be 6 and 4, and ½-LSB correction is not conducted. The same portions as those of Embodiment 1 or 5 are designated by the same reference numerals, and their description is omitted. According to the A-D converter of the embodiment, in the conversion of m bits, the digital conversion is repeatedly conducted by using the sequential approximation method from the highest-order bit to the m'th bit every p [=2] bits. In the conversion of the first p bits, which of voltage regions including an analog input from outside is roughly decided. The voltage regions are defined by dividing the potential difference between the positive and negative analog voltage sources 1 and 2 into $2^p$ levels. In the conversion of the next p bits, the decided voltage region is divided into $2^p$ levels.

In the figure, 91 designates a D-A converter which uses one of the resistance ladders of the embodiments of the invention and outputs 3 [=($2^p$-1)] levels of the $2^m$ levels of the division voltages, as the analog outputs 81, 82 and 83. A selection switch group 79 consists of switches 700 through 715 as described in detail later, and selects 3 [=($2^p$-1)] ladder taps from the 16 [=$2^m$] ladder taps of the first resistance group 17. A 6-bit control circuit 110 operating substantially in the same manner as that of the n-bit control circuit 100 of Embodiment 5 supplies in the conversion of m bits a digital value obtained by provisionally setting every 2 bits from the higher-order 6 bits to the D-A converter 91. A switch control circuit 86 output signals 84 and 85 to the selection switch group 79. The signal 84 is used for, in accordance with the digital value of n bits supplied from the 6-bit control circuit 110 as the fifth and sixth control means, connecting the corresponding ladder tap to the analog output 81, 82, 83. The signal 85 turns on or off the (0+p)-bit selection switch 700 which will be described in detail later.

3 [=$2^p$] comparators 16 receive at one inputs thereof the three analog outputs 81, 82 and 83, respectively, and at the other inputs the analog input 25 from outside. In the conversion of higher-order 4 bits, three comparison result signals 301, 302 and 303 of the comparators 16 are supplied to an encoder 305 which in turn encodes the three comparison result signals to 2-bit digital values. The digital values are supplied to the 6-bit control circuit 110. In the conversion of lower-order 2 bits, the comparison result signals 301, 302 and 303 of the comparators 16 are supplied to a multiplexer 300. The multiplexer 300 outputs one comparison result signal selected from the three comparison result signals 301, 302 and 303, to the 6-bit control circuit 110 as a low-order bit conversion result signal 304.

The selection switch group 79 consists of: the switches 701, 702 and 703 which are normally open and connect every four ladder taps of the 16 ladder taps from the higher ones to the analog outputs 81, 82 and 83, respectively, in order to divide the potential difference between the positive and negative analog voltage sources 1 and 2 into 4 levels; 4 sets of the switches 704 through 706, 707 through 709, 710 through 712, and 713 through 715 which are normally open, with every switch in each set connected to the analog output 81, 82, 83 in order to divide the potential difference of the voltage region decided in the previous conversion step every 2 bits, into 4 levels; and the (0+p)-bit selection switch 700 which is connected to the analog output and used for, when all conversion results of higher-order 4 bits indicate "0", controlling the D-A converter 91 to output a reference analog voltage for the conversion of lower-order 2 bits in the case where an analog input to be converted into a digital value from "$000000_2$" to "$000011_2$" is subjected to the digital conversion.

Next, the digital conversion operation of the thus configured A-D converter will be described.

When higher-order 2 bits are to be converted, the switches 701, 702 and 703 are turned on so that the ladder tap for outputting an analog voltage corresponding to "$110000_2$" is connected to the analog output 81, the ladder tap for outputting an analog voltage corresponding to "$100000_2$" is connected to the analog output 82, and the ladder tap for outputting an analog voltage corresponding to "$010000_2$" is connected to the analog output 83. The potential difference between the positive and negative analog voltage sources 1 and 2 is divided into 4 levels. The comparators 16 then compare the analog outputs 81, 82 and 83 with the analog input 25, respectively. On the basis of the encoding results from the encoder 305 encoding the comparison result signals 301, 302 and 303, the 6-bit control circuit 110 detects one of the division voltage regions of the four levels to which the analog input voltage belongs, and supplies to the selection switch group 79 a signal for controlling the on/off operation of switches in the conversion of the succeeding 2 bits.

When all the comparison result signals 301 through 303 are "1", for example, the analog input 25 has a voltage higher than that of the analog output 81, and hence the 6-bit control circuit 110 determines the highest-order 2 bits to be "$11_2$". When the comparison result signal 301 is "0" and the comparison result signals 302 and 303 are "1", the analog input 25 has a voltage higher than that of the analog output 82 but lower than that of the analog output 81, and hence the 6-bit control circuit 110 determines the highest-order 2 bits to be "$10_2$". When the comparison result signals 301 and 302 are "0" and the comparison result signal 303 is "1", the analog input 25 has a voltage higher than that of the analog output 83 but lower than that of the analog output 82, and hence the 6-bit control circuit 110 determines the highest-order 2 bits to be "$01_2$". When all the comparison result signals 301 through 303 are "0", the analog input 25 has a voltage lower than that of the analog output 83, and hence the 6-bit control circuit 110 determines the highest-order 2 bits to be "$00_2$". In order to obtain these 2-bit digital values, the comparison result signals 301 through 303 are encoded to 2 bits by the encoder 305, and the result of the conversion into 2-bit data is supplied to the 6-bit control circuit 110.

In the conversion of the succeeding 2 bits, the voltage region decided in the previous conversion step is divided into 4 levels. When the highest-order 2 bits are "$11_2$", the switches 704 through 706 are turned on; when the 2bits are "$10_2$", the switches 707 through 709 are turned on; when the 2 bits are "$01_2$", the switches 710 through 712 are turned on; and, when the 2 bits are "$00_2$", the switches 713 through 715 are turned on, thereby connecting the analog outputs 81, 82 and 83 to the respective ladder taps. After the analog outputs 81 through 83 are connected to the predetermined ladder taps, the analog outputs 81 through 83 are compared with the analog input 25 in the same manner as in the case of the highest-order 2 bits, so that the digital value of the succeeding 2 bits is determined, thereby obtaining a result of the A-D conversion, i.e., the digital value of the higher-order 4 bits. In this case, the analog outputs 81, 82 and 83 are sequentially connected to the adjacent ladder taps.

In the conversion of the lower-order 2 bits, depending on the comparison result signals 301 through 303 for the third and fourth bits, the multiplexer 300 selects the comparison result signal 301 corresponding to the highest one of the analog outputs 81 through 83 which are lower than the analog input 25, to determine the analog output 81, 82 or 83 to be used in the conversion of the lower-order 2 bits. At the same time, the encoder 305 encoding the comparison result signals 301 through 303 to 2-bit data completes its operation. After the selection of the analog output 81, 82 or 83, in the same manner as in the A-D converter of Embodiments 5 and 6, the lower-order 2 bits are digitized by the sequential approximation method to accomplish the A-D conversion of the 6 [=n] bits.

In contrast, when the comparison of the third and fourth bits results in that the analog input 25 is not higher than any of the analog outputs 81, 82 and 89, or that all the conversion results of the higher-order 4 bits are "0", the 6-bit control circuit 110 controls the switch control circuit 86 to output the signal 85 to the selection switch group 79, to turn on the (0+p)-bit selection switch 700 disposed for the conversion of the analog input 25 which is to be converted from a digital value "$000000_2$" to another digital value "$000011_2$", thereby connecting the analog output 83 to the resistance ladder. As described above, the (0+p)-bit selection switch 700 is used solely in the A-D conversion of a voltage region in which only the low-order p bits may be "1".

The A-D converter of the embodiment is characterized in that the converter is provided with the switch for obtaining the low-order p bits. In the embodiment, the (0+p)-bit selection switch 700 is connected to the analog output 83. As far as the multiplexer 300 can conduct a control of selecting at a suitable time the analog outputs 81, 82 and 83 as the low-order bit conversion result output 304, the manner of connecting the selection switch is not particularly restricted. The selection switch may be connected to the analog output 81 or 82.

In the embodiment, one of the resistance ladders of Embodiments 1 through 4 is used. In place of these embodiments, the A-D converter may be realized by a combination of logic circuits which can control an equivalent circuit to Embodiments 1 through 4.

In the thus configured A-D converter of the embodiment, the resistance ladder can be formed by a circuit of a small scale in the same manner as in the other embodiments, and the resolution can be improved simply by adding one switch as compared to a switch group of a conventional A-D converter of the same type.

In all the embodiments described above, the n-bit control circuits (including the m-bit control circuit, the (n-m)-bit control circuit, and the 6-bit control circuit) are equivalent to a conventional sequential approximation (sequential comparison) register used in an A-D converter which is called the sequential approximation type or the sequential comparison type. The operation of a sequential approximation type A-D converter is described in many publications relating to an A-D converter, such as "Design of A-D/D-A Converter" (Feb. 20, 1980, CQ Publication Kabushiki Kaisha, p. 11). Such an A-D converter can easily be configured by using shift registers, and flip-flops.

Although the control signals for the n-bit control circuit, the comparators, switches and the switching tree are not described in detail, these components are controlled in a similar manner as those used in the prior art. The A-D converter of the invention, particularly the n-bit control circuit and the comparators operate to attain a desired accuracy in accordance with the control signals. The control signals required for the A-D conversion of low-order (n-m) bits can easily be produced by logic circuits on the basis of the signals generated in the process of the A-D conversion which has been described in conjunction with the embodiments.

The A-D converter of the invention described above sequentially conducts the conversions of n bits. When the time to complete the conversion process may be varied, a desired accuracy is attainable by a conversion method in which an approximate value is obtained by incrementing or decrementing low-order (n-m) bits.

In the embodiments described above, the resistance ladder, the D-A converter, and the A-D converter are so configured as to have the connecting means for the positive and negative analog voltage sources incorporated in an LSI. A configuration in which the paths between the connecting means of the second and third resistance groups and the analog voltage sources are formed outside an LSI, and the paths are connected to the analog voltage sources outside the LSI by means of a program or the like can attain the same effects as those of the embodiments. In this alternative, the connecting means are not restricted to transistors, and may be configured by mechanical parts such as relays.

The n-bit control circuits (including the m-bit control circuit, the (n-m)-bit control circuit, and the 6-bit control circuit) control the switching tree, and the means for connecting the resistance ladder to the positive and negative analog voltage sources. It is a matter of course that the data used by the n-bit control circuits to control the switching tree and the means for the analog voltage sources can be read out in the same manner as those used in control circuits of a prior art D-A converter or A-D converter. The n-bit control circuits control the analog output voltage of the incorporated D-A converter, and convert an an&log input voltage from outside into a digital value in accordance with a result of comparison in the comparator between the analog output voltage of the D-A converter and the external analog input voltage.

Such structure is a matter of course that data can be not only written into the control circuit which is intended only for controlling the D-A converter, but read out therefrom if required.

The control circuit intended for controlling the A-D converter may have a configuration in which high-order m bits are controlled in the same manner as in a prior art A-D converter, and low-order (n-m) bits are controlled by a combination of connecting means for connecting a resistance ladder to the positive and negative analog voltage sources in accordance with the above-described embodiments. When n=6 and m=4, for example, in the conversion of the fifth bit, the switching tree is fixed by the digital value determined in the conversion of the fourth bit, and the signals f and j shown in the figures are generated so that the path of the connecting means is selected by which the voltage of the ladder tap is shifted upward by $\frac{1}{2}^5$ of the potential difference between the positive and negative analog voltage sources from the analog voltage input to the comparator in the conversion of the fourth bit. In the conversion of the sixth bit, when the comparison of the fifth bit results in that the analog input voltage is lower than the analog output, the signals g and k shown in the figures are generated so that the path of the connecting means is selected by which the voltage of the ladder tap is shifted downward by $\frac{1}{2}^6$ of the potential difference between the positive and negative analog voltage sources from the analog voltage input to the comparator in the conversion of the fifth bit. When the comparison of the fifth bit results in that the analog input voltage is higher than the analog output, the signals e and i shown in the figures are generated so that the path of the connecting means is selected by which the voltage of the ladder tap is shifted upward by $\frac{1}{2}^6$ of the potential difference between the positive and negative analog voltage sources from the analog voltage input to the comparator in the conversion of the fifth bit. The configuration for generating such signals can easily be realized by logic circuits.

In an A-D converter of 6-bit resolution using a prior art resistance ladder the resistance ladder requires at least 64 resistors, and a switching tree for obtaining an analog output needs 126 switches. By contrast, in an A-D converter of 6-bit resolution using the resistance ladder of the invention, the number of ladder taps is 16 or corresponds to the 4-bit resolution, and hence a switching tree for obtaining an analog output can be configured by using 30 switches. Consequently, the A-D converter of 6-bit resolution enhanced by 2 bits can be realized by using 8 switches at most for connecting the resistance ladder to analog power sources. Therefore, the 6-bit resolution can be attained only by increasing 30% or so the area of the resistors which make up the major portion of the area of the A-D converter in comparison with a conventional 4-bit A-D converter.

Embodiment 8

When the A-D converters of Embodiment 5 and 6 are to be tested, assuming that n=6 and m=4, there are 16 ladder taps, and 16 paths extending from the ladder taps to the analog output. Each of the ladder taps can generate voltages of 4 levels, so that voltages of 64 levels are generated in total. Three kinds of voltages are generated in accordance with 4 types of combinations of the connecting means 21 through 24 and 31 through 34 between the positive and negative analog voltage sources 1 and 2. Therefore, if one ladder tap voltage among 64 analog voltages and 3 consecutive points to the ladder tap voltage are tested, the remaining voltages can be tested by testing only 15 points of the remaining 15 ladder taps. In other words, testing on 19 points in total corresponds to checking of 64 points, thereby shortening the test time. Considering that the second and third resistance groups 18 and 19 have errors, it is preferable to test consecutive 4 points each in the vicinity of the highest and lowest taps. In this case, testing on 23 points is sufficient for the check of the voltages of 64 levels.

Figure 17:
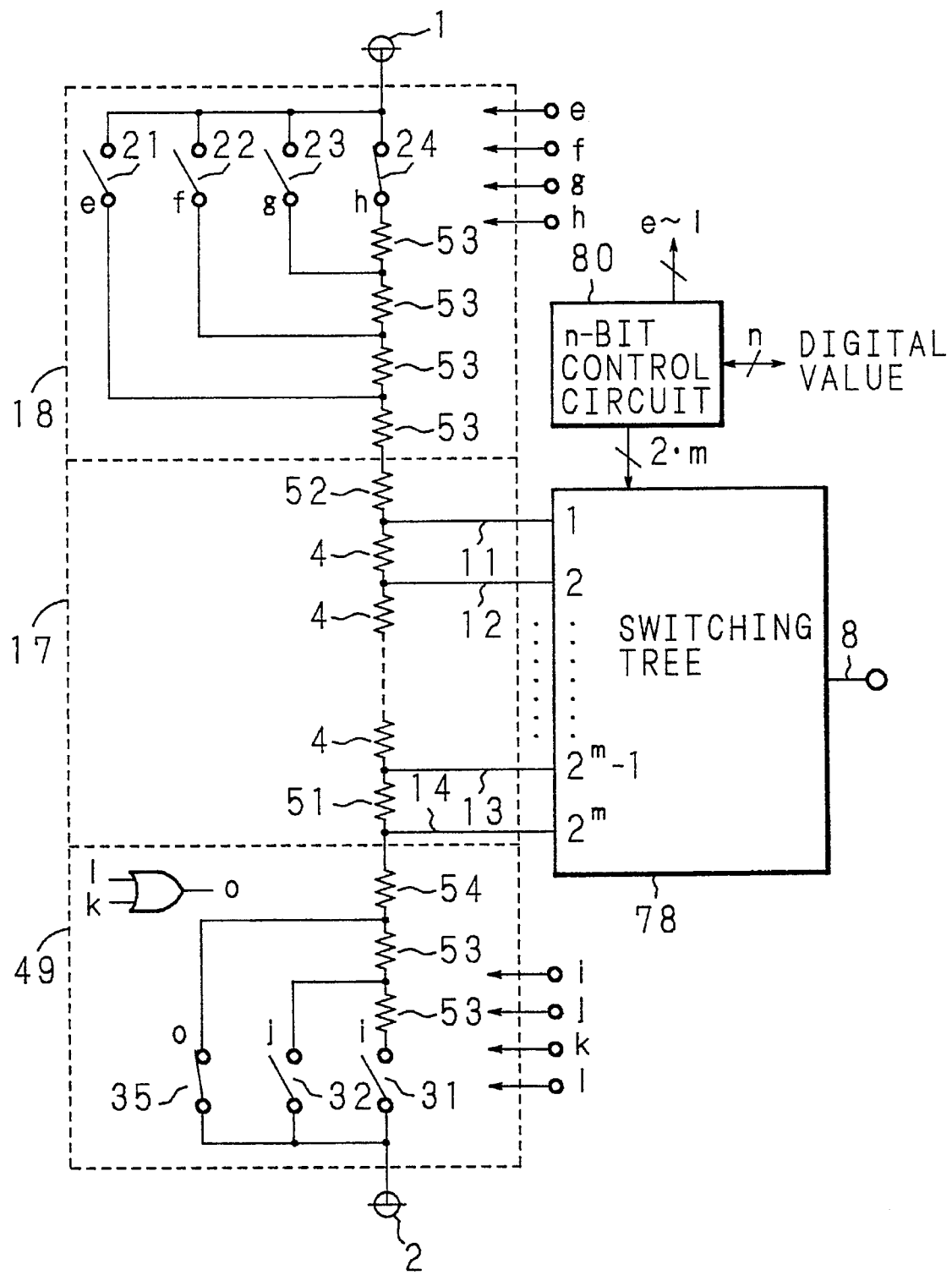
FIG. 17 is a circuit block diagram showing the construction of a modification of the resistance ladder of the invention, and a D-A converter using the modified resistance ladder.

FIG. 17 shows the construction of a D-A converter with a resistance ladder of the invention, where the $\frac{1}{2}$-LSB correction is conducted on all over the outputs from the resistance ladder.

In this resistance ladder, the resistance group 49 comprises a resistor 54 having a resistance of $R/2^{n-m+1}$ for conducting the $\frac{1}{2}$-LSB correction, resistors 53 each having a resistance of $R/2^{n-m}$, and connecting means 31, 32, 35 for selectively connecting nodes of the resistors 53, 53, 54 and the negative analog voltage source 2. The connecting means 35 is controlled by a control signal o which is the ORed result of the signals l and k, and plays a role of both the connecting means 33, 34 in the Embodiment 1. In this embodiment, the resistor 51 has a resistance of $\{(2^{n-m+1}-2)/(2^{n-m+1})\}\cdot R$, and the resistor 52 has a resistance of $R/2^{n-m+1}$. When assuming that n=6 and m=4 the resistor 51 has a resistance of 6R/8 and each of the resistors 52, 54 has a resistance of R/8. The control signal o of the connecting means 35 becomes significant when the digital values of the low-order 2 bits are "11" whereby the resistance ladder functions just as in Embodiment 1.

By constructing as above, the $\frac{1}{2}$-LSB correction is conducted on all the outputs from the resistance ladder, which is easily presumed from the function of the resistance ladder in the other embodiments. According to this resistance ladder, apparent from the construction of the embodiment in FIG. 7, a large number of resistors are necessary to be arranged in parallel or in series in order to obtain such the resistance 6R/8 or R/8. Though the portion where the resistors 51, 52, 54 are arranged is in need of the large area corresponding to the number of the resistors comparing with the other embodiments, the number of the connecting means decreases when setting the resistance of the resistor 51 to be not exceeding that of the resistor 4 and the total resistance of the resistors 51, 52, 54 to be R in this circuit. When using the resistance ladder of this embodiment in the circuit without conducting the ½-LSB correction, the number of the connecting means is reduced as compared to that used in the resistance ladder of Embodiment 1. In this case, the resistance of the resistor 52 is set to be 0 Ω, that of the resistor 51 to be 3R/4, and that of the resistor 54 to be R/4.

Figure 18:
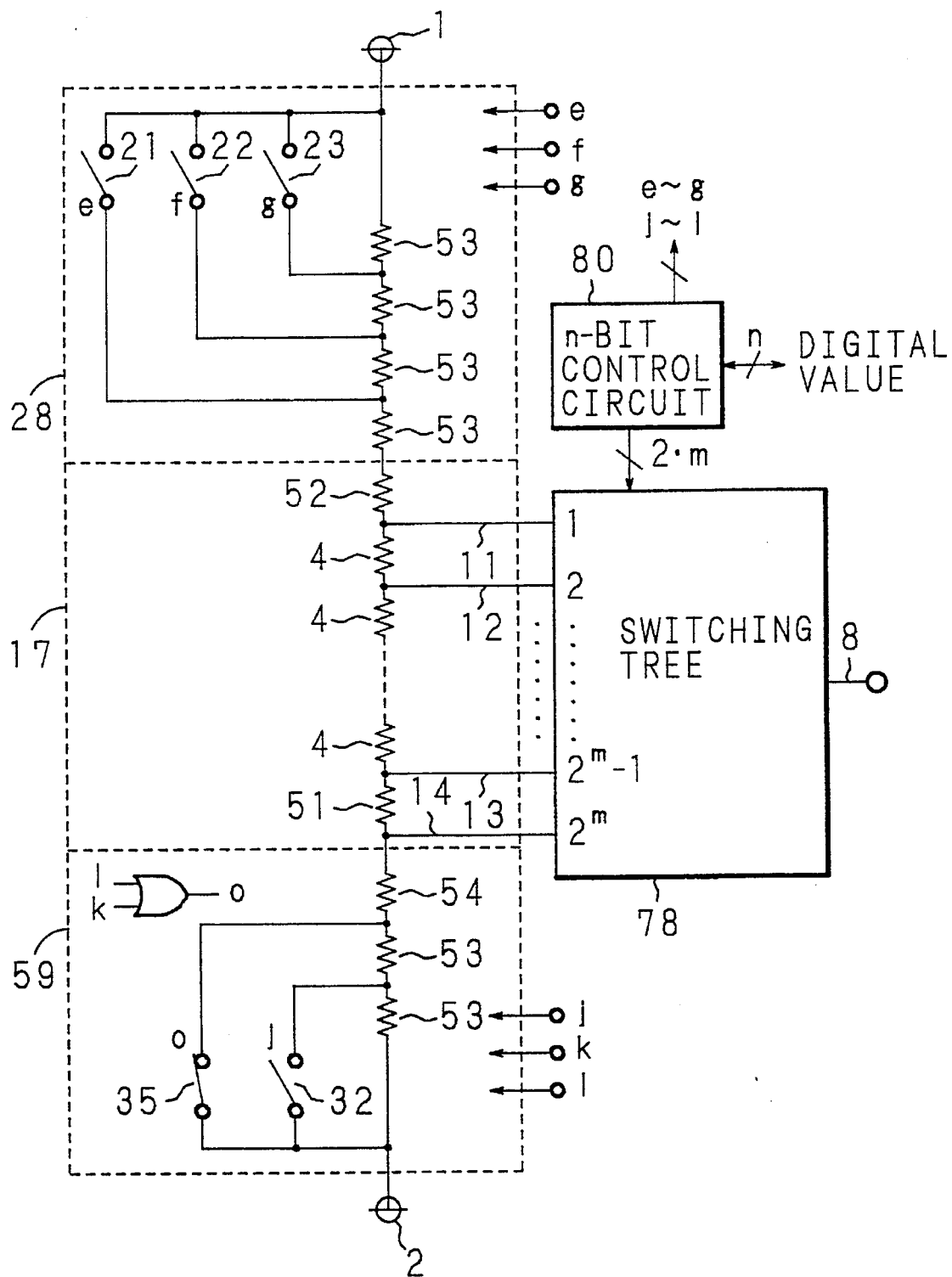
FIG. 18 is a circuit block diagram showing the construction of another modification of the resistance ladder of the invenetion, and a D-A converter using the modified resistance ladder.

FIG. 18 shows the construction where the connecting means between the positive analog voltage source 1 and the second resistance group 28, and that between the negative analog voltage source 2 and a third resistance group 59 are omitted from the construction shown in FIG. 17, similar to Embodiment 2, and the analog voltage sources 1,2 are directly connected to the resistance groups 28, 59, respectively. When the resistance ladder is controlled as in Embodiment 2 and the control signal o of the connecting means 35 becomes significant according to the digital values of the low-order 2 bits being "11", the circuit evidently functions as in Embodiment 2.

Figure 19:
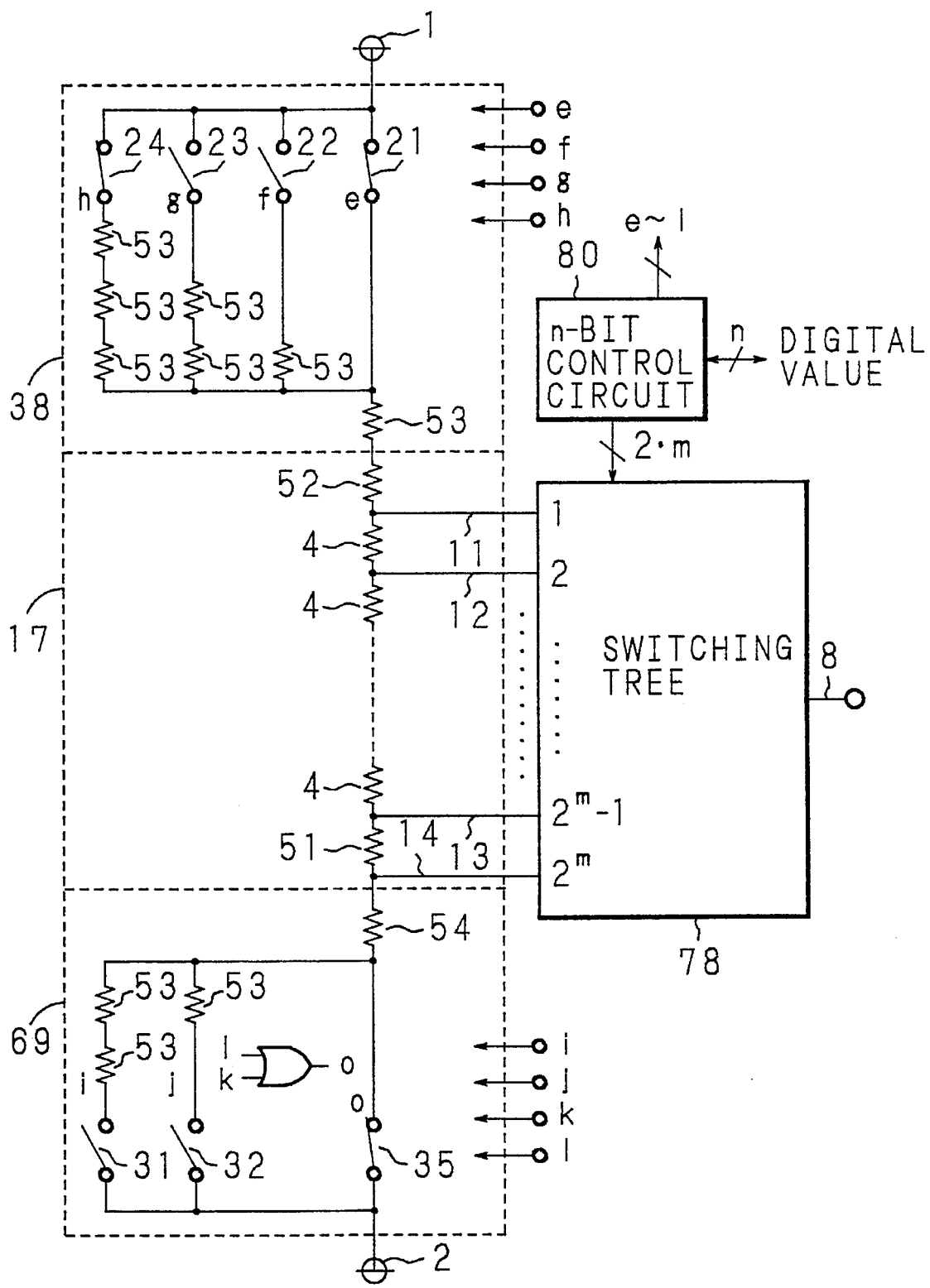
FIG. 19 is a circuit block diagram showing the construction of still another modification of the resistance ladder of the invention, and a D-A converter using the modified resistance ladder.

FIG. 19 shows the construction of a D-A converter with a resistance ladder modified from that in FIG. 17 similarly to Embodiment 3 (refer to FIG. 6) modified from Embodiment 1. A third resistance group 69 comprises 2 [=$2^{n-m}$-2] strings of series resistors, and the connecting means 31, 32, 35 which selectively connect one end of the strings of the series resistors individually, and the other ends of the strings in common to the negative analog voltage source 2. In each string of the series resistors, resistors each having a resistance of $R/2^{n-m}$ are connected in series, and the number of the resistors in each string sequentially decreases by one from 2 [=$2^{n-m}$-2] to 1. The other ends of the strings of the resistors are connected in common to the first resistance group 17 via a resistor 54 having a resistance of $R/2^{n-m+1}$. This modified resistance ladder functions as the resistance ladder shown in FIG. 17, thereby omitting the explanation here.

Figure 20:
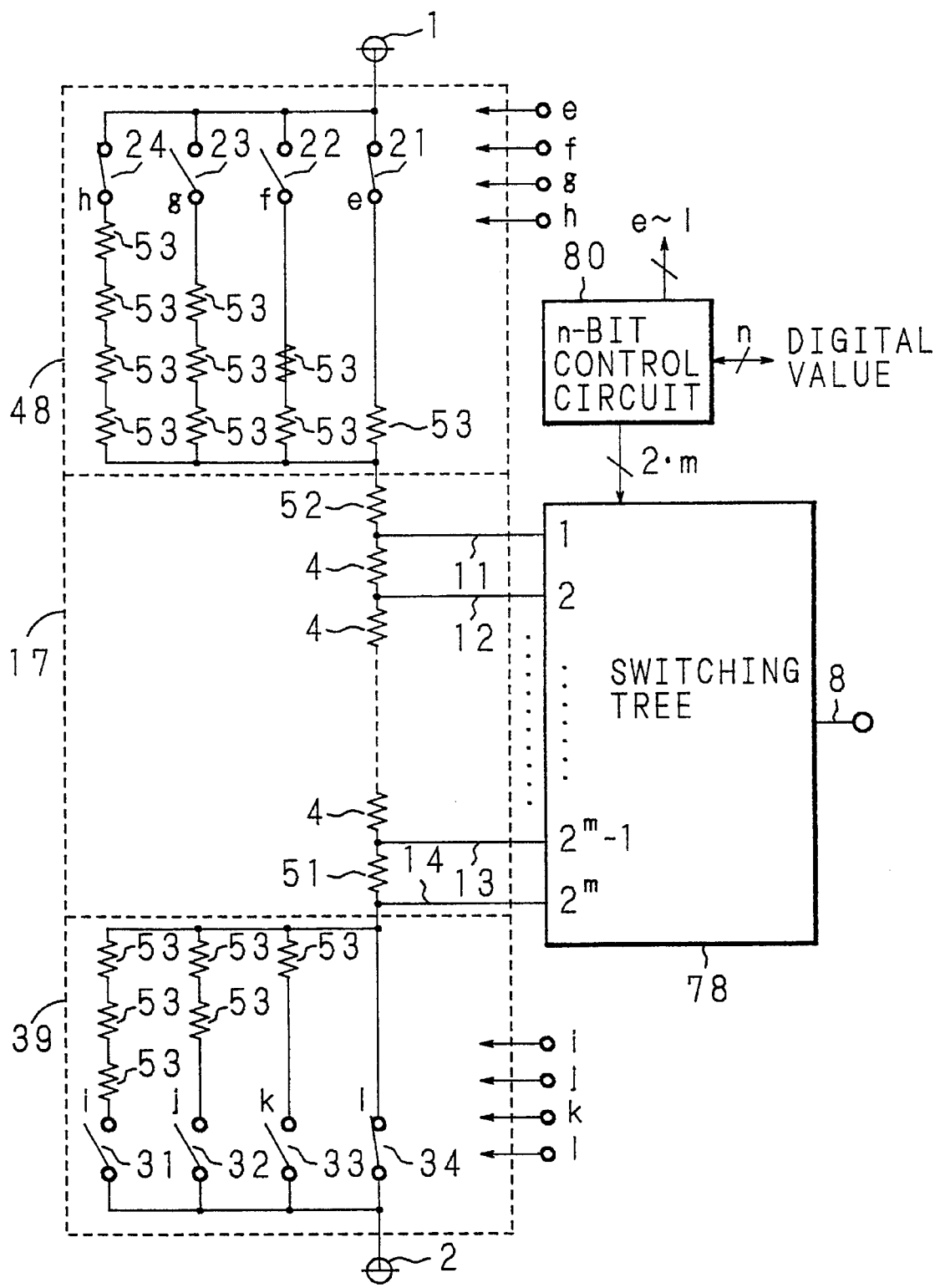
FIG. 20 is a circuit block diagram showing the construction of a further modification of the resistance ladder of the invention, and a D-A convertere using the modified resistance ladder.

FIG. 20 is a circuit diagram showing the construction of a D-A converter of n-bit resolution using a resistance ladder modified from Embodiment 3. Also in the embodiment, same as in Embodiment 1, it is assumed that n=6 and m=4, and the ½-LSB correction is not conducted. The same portions as those of Embodiment 1 are designated by the same reference numerals, and their description is omitted here. This modification is different from Embodiment 1 in that the construction of a second resistance group 48 and a third resistance group 39. The construction of the third resistance group 39 is same as Embodiment 3 (refer to FIG. 6) and function of the resistance ladder is same as in Embodiment 3, thereby omitting the explanation here.

The second resistance group 48 comprises 4 [=$2^{n-m}$] strings of series resistors 53, and the connecting means 21 through 24 which selectively connect one end of the strings of the series resistors to the positive analog voltage source 1. In each string, resistors 53 each having a resistance of $R/2^{n-m}$ are connected in series, and the number of the resistors in each string sequentially decreases one by one from 4 [=$2^{n-m}$] to 1. The other ends of the strings are connected in common to the first resistance group 17.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

TABLE 1

| a | b | c | d | VOLTAGE OF ANALOG OUTPUT [V] | LADDER TAP |
|---|---|---|---|---|---|
| 0 | 0 | 0 | 0 | 0.000 | T1 |
| 0 | 0 | 0 | 1 | 0.125 | T2 |
| 0 | 0 | 1 | 0 | 0.375 | T3 |
| 0 | 0 | 1 | 1 | 0.625 | T4 |
| 0 | 1 | 0 | 0 | 0.875 | T5 |
| 0 | 1 | 0 | 1 | 1.125 | T6 |
| 0 | 1 | 1 | 0 | 1.375 | T7 |
| 0 | 1 | 1 | 1 | 1.625 | T8 |
| 1 | 0 | 0 | 0 | 1.875 | T9 |
| 1 | 0 | 0 | 1 | 2.125 | T10 |
| 1 | 0 | 1 | 0 | 2.375 | T11 |
| 1 | 0 | 1 | 1 | 2.625 | T12 |
| 1 | 1 | 0 | 0 | 2.875 | T13 |
| 1 | 1 | 0 | 1 | 3.125 | T14 |
| 1 | 1 | 1 | 0 | 3.375 | T15 |
| 1 | 1 | 1 | 1 | 3.625 | T16 |

What is claimed is:

1. A resistance ladder which divides a potential difference between first and second reference voltage sources into $2^n$ levels, comprising:

a first resistance group comprising: a string of resistors in which plural resistors are connected in series with a total sum of resistances being ($2^m$-1). R (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: a string of resistors in which ($2^{n-m}$-1) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group.

2. A resistance ladder according to claim 1 wherein each of the resistors of said first resistance group is constituted by plural unit resistors connected in series, said unit resistors having substantially the same resistance, and each of the resistors of said second and third resistance groups is constituted by a plurality of said unit resistors connected in parallel to attain a resistance of $R/2^{n-m}$.

3. A D-A converter comprising: the resistance ladder according to claim 1; means for selecting one ladder tap to take out an analog voltage corresponding to a digital value of the high-order m bits among the n bits, from said $2^m$ ladder taps of said first resistance group of the resistance ladder; and first control means for, in accordance with a case of converting the high-order m bits or a case of converting the low-order (n-m) bits, forming a connecting path between the first and second reference voltage sources with a resistance of $2^m \cdot R$ appearing therebetween, by selectively combining the connecting means of said second and third resistance groups and for, when converting the low-order (n-m) bits, forming said connecting path with said ladder tap remaining to be selected, to take out an analog voltage for the m bits from said ladder tap.

4. An A-D converter comprising: the D-A converter of n-bit resolution according to claim 3; a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high-order m bits, causing said D-A converter to form a connecting path through which a potential difference between the first and second reference voltage sources is divided into $2^m$ levels, and for, in a conversion of the low-order (n-m) bits, causing said D-A converter to change the connecting path on the basis of the comparison result of said comparator with the ladder tap remaining to be selected in the conversion of the m bits, thereby changing at least (n-m) times an analog output from the ladder tap selected in the conversion of m bits.

5. A method of testing the A-D converter according to claim 4, wherein tests equivalent to tests on $2^n$ points are done by conducting: tests on $2^m$ points in which each of the ladder taps to take out different anallog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2^n}$ bit for every level.

6. An A-D converter comprising:
 (a) a D-A converter including:
  the resistance ladder according to claim 1;
  means for selecting one ladder tap to take out an analog voltage corresponding to a digital value of the high-order m-bits among the n bits, from the $2^m$ ladder taps of the first resistance group of said resistance ladder; and
  third control means for forming a connecting path between the first and second reference voltage sources by selectively combining said connecting means of said second and third resistance groups, to take out analog voltages of $2^m$ levels having an offset which increases by a voltage of $\frac{1}{2^n}$ of the potential difference between the first and second reference voltage sources, and also a resistance of $2^m \cdot R$ appears between the first and second reference voltage sources;
 (b) a comparator for comparing an analog output for the m bits from said D-A converter with an analog input to convert; and
 (c) fourth control means for supplying to said D-A converter a digital value which is provisionally set in order to obtain a reference analog voltage for a comparison for digital-converting said analog input.

7. A method of testing the A-D converter according to claim 6, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2^n}$ bit for every level.

8. An A-D converter comprising:
 (a) a D-A converter including:
  the resistance ladder according to claim 1 which divides the potential difference between said first and second reference voltage sources into $2^n$ levels;
  means for, from the $2^m$ (where n>m) ladder taps of said resistance ladder, selecting $(2^p-1)$(where $m \geq p$) ladder taps to take out an analog voltage corresponding to a digital value of p bits of the high-order m bits among the n bits;
  fifth control means for, in accordance with a case of converting the low-order (n-m) bits, forming a connecting path between said first and second reference voltage sources in which a resistance of $2^m \cdot R$ appears between said first and second reference voltage sources by selectively combining said connecting means of said second and third resistance groups;
 (b) $(2^p-1)$ comparators for comparing analog outputs from said D-A converter with an analog input to convert;
 (c) ladder tap selecting means for, from ladder taps which are selected in the final stage of the conversion of the high-order m bits to take out a voltage lower than said analog input, selecting a ladder tap to take out the highest voltage, as a ladder tap which is to be used in the conversion of the low-order (n-m) bits;
 (d) sixth means for, in the conversion of the high-order m bits, causing said D-A converter to form a connecting path in which a potential difference between said first and second reference voltage sources is divided into $2^m$ levels; for sequentially supplying to said D-A converter with a digital value for every bits, with starting from the most significant bit of the n bits to the m'th bit, which is provisionally set in order to obtain a reference analog voltage for a comparison for digital-converting said analog input, thereby causing said D-A converter to repeat the analog conversion for every p bits; for, in each analog conversion, causing said comparators to compare the analog output from said D-A converter with said analog input to conduct a digital conversion for every p bits; and for, in the conversion of the low-order (n-m) bits, supplying said D-A converter with a digital value which is provisionally set in order to obtain a reference analog voltage for a comparison for digital-converting the low-order (n-m) bits, while making said D-A converter to change the connecting path on the basis of a comparison result of said comparators with the ladder tap remaining to be selected in the conversion of the m bits, thereby changing at least (n-m) times an analog output from the ladder tap selected in the conversion of the m bits; and
 (e) means for, when said ladder tap selecting means selects none of said $(2^p-1)$ ladder taps, selecting a ladder tap which is to be used in the conversion of the low-order (n-m) bits.

9. A method of testing the A-D converter according to claim 8, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

10. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: a string of resistors in which $(2^{n-m}-1)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group, the other end of said string of the resistors being connected to said second reference voltage source.

11. A resistance ladder according to claim 10 wherein each of the resistors of said first resistance group is constituted by plural unit resistors connected in series, said unit resistors having substantially the same resistance, and each of the resistors of said second and third resistance groups is constituted by a plurality of said unit resistors connected in parallel to attain a resistance of $R/2^{n-m}$.

12. A D-A converter comprising: the resistance ladder according to claim 10; means for selecting one ladder tap to take out an analog voltage corresponding to a digital value of the high-order m bits among the n bits, from said $2^m$ ladder taps of said first resistance group of the resistance ladder; and first control means for, in accordance with a case of converting the high-order m bits or a case of converting the low-order (n-m) bits, forming a connecting path between the first and second reference voltage sources with a resistance of $2^m \cdot R$ appearing therebetween, by selectively combining the connecting means of said second and third resistance groups and for, when converting the low-order (n-m) bits, forming said connecting path with said ladder tap remaining to be selected, to take out an analog voltage for the m bits from said ladder tap.

13. An A-D converter comprising: the D-A converter of n-bit resolution according to claim 12; a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high-order m bits, causing said D-A converter to form a connecting path through which a potential difference between the first and second reference voltage sources is divided into $2^m$ levels, and for, in a conversion of the low-order (n-m) bits, causing said D-A converter to change the connecting path on the basis of the comparison result of said comparator with the ladder tap remaining to be selected in the conversion of the m bits, thereby changing at least (n-m) times an analog output from the ladder tap selected in the conversion of m bits.

14. A method of testing the A-D converter according to claim 13, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

15. An A-D converter comprising:

(a) a D-A converter including:

the resistance ladder according to claim 10;

means for selecting one ladder tap to take out an analog voltage corresponding to a digital value of the high-order m-bits among the n bits, from the $2^m$ ladder taps of the first resistance group of said resistance ladder; and third control means for forming a connecting path between the first and second reference voltage sources by selectively combining said connecting means of said second and third resistance groups, to take out analog voltages of $2^m$ levels having an offset which increases by a voltage of $\frac{1}{2}^n$ of the potential difference between the first and second reference voltage sources, and also a resistance of $2^m 19\ R$ appears between the first and second reference voltage sources;

(b) a comparator for comparing an analog output for the m bits from said D-A converter with an analog input to convert; and (c) fourth control means for supplying to said D-A converter a digital value which is provisionally set in order to obtain a reference analog voltage for a comparison for digital-converting said analog input.

16. A method of testing the A-D converter according to claim 15, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

17. An A-D converter comprising:

(a) a D-A converter including:

the resistance ladder according to claim 10 which divides the potential difference between said first and second reference voltage sources into $2^n$ levels;

means for, from the $2^m$ (where n>m) ladder taps of said resistance ladder, selecting $(2^p-1)$ (where $m \geq p$) ladder taps to take out an analog voltage corresponding to a digital value of p bits of the high-order m bits among the n bits;

fifth control means for, in accordance with a case of converting the low-order (n-m) bits, forming a connecting path between said first and second reference voltage sources in which a resistance of $2^m \cdot R$ appears between said first and second reference voltage sources by selectively combining said connecting means of said second and third resistance groups;

(b) ($2^p$-1) comparators for comparing analog outputs from said D-A converter with an analog input to convert;

(c) ladder tap selecting means for, from ladder taps which are selected in the final stage of the conversion of the high-order m bits to take out a voltage lower than said analog input, selecting a ladder tap to take out the highest voltage, as a ladder tap which is to be used in the conversion of the low-order (n-m) bits;

(d) sixth means for, in the conversion of the high-order m bits, causing said D-A converter to form a connecting path in which a potential difference between said first and second reference voltage sources is divided into $2^m$ levels; for sequentially supplying to said D-A converter with a digital value for every bits, with starting from the most significant bit of the n bits to the m'th bit, which is provisionally set in order to obtain a reference analog voltage for a comparison for digital-converting said analog input, thereby causing said D-A converter to repeat the analog conversion for every p bits; for, in each analog conversion, causing said comparators to compare the analog output from said D-A converter with said analog input to conduct a digital conversion for every p bits; and for, in the conversion of the low-order (n-m) bits, supplying said D-A converter with a digital value which is provisionally set in order to obtain a reference analog voltage for a comparison for digital-converting the low-order (n-m) bits, while making said D-A converter to change the connecting path on the basis of a comparison result of said comparators with the ladder tap remaining to be selected in the conversion of the m bits, thereby changing at least (n-m) times an analog output from the ladder tap selected in the conversion of the m bits; and (e) means for, when said ladder tap selecting means selects none of said ($2^p$-1) ladder taps, selecting a ladder tap which is to be used in the conversion of the low-order (n-m) bits.

18. A method of testing the A-D converter according to claim 17, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

19. A resistance ladder which divides a potential difference between first and second reference voltage sources into $2^n$ levels, comprising:

a first resistance group comprising: a string of resistors in which plural resistors are connected in series with a total sum of resistances being ($2^m$-1)·R (where n>m); and $2^m$ ladder taps respectively connected to nodes of the resistors and one end of said string of the resistors to take out respective division voltages of the potential difference between said first and second reference voltage sources;

a second resistance group comprising: ($2^{n-m}$-1) strings of resistors consisting of resistors each having a resistance of $R/2^{n-m}$ connected in series, the number of the resistors in each of said strings of the resistors decreasing in the connected order by one from ($2^{n-m}$-1) to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: ($2^{n-m}$-1) strings of resistors consisting of resistors each having a resistance of $R/2^{n-m}$ are connected in series, the number of the resistors in each of said strings of the resistors decreasing in the connected order by one from ($2^{n-m}$-1) to one; and connecting means for selectively connecting either one end of said strings of the resistors, or all the other ends of said strings of the resistors to said second reference voltage source, said other ends of the strings of the resistors being commonly connected to the other end of said first resistance group.

20. A resistance ladder according to claim 19 wherein each of the resistors of said first resistance group is constituted by plural unit resistors connected in series, said unit resistors having substantially the same resistance, and each of the resistors of said second and third resistance groups is constituted by a plurality of said unit resistors connected in parallel to attain a resistance of $R/2^{n-m}$.

21. A D-A converter comprising: the resistance ladder according to claim 19; means for selecting one ladder tap to take out an analog voltage corresponding to a digital value of the high-order m bits among the n bits, from said $2^m$ ladder taps of said first resistance group of the resistance ladder; and first control means for, in accordance with a case of converting the high-order m bits or a case of converting the low-order (n-m) bits, forming a connecting path between the first and second reference voltage sources with a resistance of $2^m \cdot R$ appearing therebetween, by selectively combining the connecting means of said second and third resistance groups and for, when converting the low-order (n-m) bits, forming said connecting path with said ladder tap remaining to be selected, to take out an analog voltage for the m bits from said ladder tap.

22. An A-D converter comprising: the D-A converter of n-bit resolution according to claim 21; a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high-order m bits, causing said D-A converter to form a connecting path through which a potential difference between the first and second reference voltage sources is divided into $2^m$ levels, and for, in a conversion of the low-order (n-m) bits, causing said D-A converter to change the connecting path on the basis of the comparison result of said comparator with the ladder tap remaining to be selected in the conversion of the m bits, thereby changing at least (n-m) times an analog output from the ladder tap selected in the conversion of m bits.

23. A method of testing the A-D converter according to claim 22, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

24. An A-D converter comprising:
   (a) a D-A converter including:
      the resistance ladder according to claim 19;
      means for selecting one ladder tap to take out an analog voltage corresponding to a digital value of the high-order m-bits among the n bits, from the $2^m$ ladder taps of the first resistance group of said resistance ladder; and
      third control means for forming a connecting path between the first and second reference voltage sources by selectively combining said connecting means of said second and third resistance groups, to take out analog voltages of $2^m$ levels having an offset which increases by a voltage of $\frac{1}{2}^n$ of the potential difference between the first and second reference voltage sources, and also a resistance of $2^m \cdot R$ appears between the first and second reference voltage sources;
   (b) a comparator for comparing an analog output for the m bits from said D-A converter with an analog input to convert; and
   (c) fourth control means for supplying to said D-A converter a digital value which is provisionally set, in order to obtain a reference analog voltage for a comparison for digital-converting said analog input.

25. A method of testing the A-D converter according to claim 24, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

26. An A-D converter comprising:
   (a) a D-A converter including:
      the resistance ladder according to claim 19 which divides the potential difference between said first and second reference voltage sources into $2^n$ levels;
      means for, from the $2^m$ (where n>m) ladder taps of said resistance ladder, selecting $(2^p-1)$ (where $m \geq p$) ladder taps to take out an analog voltage corresponding to a digital value of p bits of the high-order m bits among the n bits;
      fifth control means for, in accordance with a case of converting the low-order (n-m) bits, forming a connecting path between said first and second reference voltage sources in which a resistance of $2^m \cdot R$ appears between said first and second reference voltage sources by selectively combining said connecting means of said second and third resistance groups;
   (b) $(2^p-1)$ comparators for comparing analog outputs from said D-A converter with an analog input to convert;
   (c) ladder tap selecting means for, from ladder taps which are selected in the final stage of the conversion of the high-order m bits to take out a voltage lower than said analog input, selecting a ladder tap to take out the highest voltage, as a ladder tap which is to be used in the conversion of the low-order (n-m) bits;
   (d) sixth means for, in the conversion of the high-order m bits, causing said D-A converter to form a connecting path in which a potential difference between said first and second reference voltage sources is divided into $2^m$ levels; for sequentially supplying to said D-A converter with a digital value for every bits, with starting from the most significant bit of the n bits to the m'th bit, which is provisionally set in order to obtain a reference analog voltage for a comparison for digital-converting said analog input, thereby causing said D-A converter to repeat the analog conversion for every p bits; for, in each analog conversion, causing said comparators to compare the analog output from said D-A converter with said analog input to conduct a digital conversion for every p bits; and for, in the conversion of the low-order (n-m) bits, supplying said D-A converter with a digital value which is provisionally set in order to obtain a reference analog voltage for a comparison for digital-converting the low-order (n-m) bits, while making said D-A converter to change the connecting path on the basis of a comparison result of said comparators with the ladder tap remaining to be selected in the conversion of the m bits, thereby changing at least (n-m) times an analog output from the ladder tap selected in the conversion of the m bits; and
   (e) means for, when said ladder tap selecting means selects none of said $(2^p-1)$ ladder taps, selecting a ladder tap which is to be used in the conversion of the low-order (n-m) bits.

27. A method of testing the A-D converter according to claim 26, wherein tests equivalent to tests on $2^n$ points are done by conducting: tests on $2^m$ points in which each of the ladder taps to take out different analog outputs of $2^m$ levels is tested; and precision tests on $2 \cdot 2^{n-m}$ points conducted on the two ladder taps to take out analog voltages respectively corresponding to minimum and maximum digital values of the m bits, or conducted on the other two ladder taps in the vicinity of the former two ladder taps, by changing the connecting path to vary the taking out voltages from the two ladder taps in $2^{n-m}$ levels respectively by an analog voltage corresponding to a $\frac{1}{2}^n$ bit for every level.

28. A resistance ladder which divides a potential difference between first and second reference voltage sources into $2^n$ levels, comprising:
   a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;
   a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: a string of resistors in which ($2^{n-m}$-1) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group, the other end of said string of the resistors being connected to said second reference voltage source.

29. A resistance ladder which divides a potential difference between first and second reference voltage sources into $2^n$ levels, comprising:

a first resistance group comprising: a string of resistors in which plural resistors are connected in series with a total sum of resistances being ($2^m$-1)·R (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: ($2^{n-m}$-1) strings of resistors consisting of resistors each having a resistance of $R/2^{n-m}$ are connected in series, the number of the resistors in each of said strings of the resistors decreasing in the connected order by one from ($2^{n-m}$-1) to one; and connecting means for selectively connecting either one end of said strings of the resistors, or all the other ends of said strings of the resistors to said second reference voltage source, said other ends of the strings of the resistors being commonly connected to the other end of said first resistance group.

30. A resistance ladder which divides a potential difference between first and second reference voltage sources into $2^n$ levels, comprising:

a first resistance group comprising: a string of resistors in which plural resistors are connected in series with a total sum of resistances being ($2^m$-1)·R-R/$2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: a string of resistors in which ($2^{n-m}$-2) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$.

31. A resistance ladder which divides a potential difference between first and second reference voltage sources into $2^n$ levels, comprising:

a first resistance group comprising: a string of resistors in which plural resistors are connected in series with a total sum of resistances being ($2^m$-1)·R-R/$2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: a string of resistors in which ($2^{n-m}$-2) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$, the other end of said string of the resistors being connected to said second reference voltage source.

32. A resistance ladder which divides a potential difference between first and second reference voltage sources into $2^n$ levels, comprising:

a first resistance group comprising: a string of resistors in which plural resistors are connected in series with a total sum of resistances being ($2^m$-1)·R-R/$2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one end of said string of the resistors or one of the nodes of the resistors to said first reference voltage source which supplies a higher voltage, the other end of said series of the resistors being connected to said first resistance group; and a third resistance group comprising: ($2^{n-m}$-2) strings of resistors consisting of resistors each having a resistance of $R/2^{n-m}$ are connected in series, the number of the resistors in each of said strings of the resistors decreasing in the connected order by one from ($2^{n-m}$-2) to one; and connecting means for selectively connecting either one end of said strings of the resistors, or all the other ends of said strings of the resistors to said second reference voltage source, said other ends of the strings of the resistors being commonly connected to the other end of said first resistance group via a resistor having a resistance of $R/2^{n-m+1}$.

33. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: a string of resistors in which $(2^{n-m}-1)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group.

34. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: $(2^{n-m}-1)$ strings of resistors consisting of resistors each having a resistance of $R/2^{n-m}$ are connected in series, the number of the resistors in each of said strings of the resistors decreasing in the connected order by one from $(2^{n-m}-1)$ to one; and connecting means for selectively connecting either one end of said strings of the resistors, or all the other ends of said strings of the resistors to said second reference voltage source, said other ends of the strings of the resistors being commonly connected to the other end of said first resistance group.

35. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R - R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: a string of resistors in which $(2^{n-m}-2)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$.

36. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R - R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: a string of resistors in which $(2^{n-m}-2)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$, the other end of said string of the resistors being connected to said second reference voltage source.

37. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R - R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: a string of resistors in which $2^{n-m}$ resistors each having a resistance of $R/2^{n-m}$ are connected in series; and connecting means for selectively connecting one of the nodes of the resistors to said first reference voltage source, one end of said string of the resistors being connected to said first resistance group, the other end of said string of the resistors being connected to said first reference voltage source which supplies a higher voltage; and a third resistance group comprising: $(2^{n-m}-2)$ strings of resistors consisting of resistors each having a resistance of $R/2^{n-m}$ are connected in series, the number of the resistors in each of said strings of the resistors decreasing in the connected order by one from $(2^{n-m}-2)$ to one; and connecting means for selectively connecting either one end of said strings of the resistors, or all the other ends of said strings of the resistors to said second reference voltage source, said other ends of the strings of the resistors being commonly connected to the other end of said first resistance group via a resistor having a resistance of $R/2^{n-m+1}$.

38. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ connected in series, the number of the resistors in each of said strings of the resistors decreasing in the connected order by one from $(2^{n-m}-1)$ to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: a string of resistors in which $(2^{n-m}-1)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group.

39. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ connected in series, the number of the resistors in each of said strings of the resistors decreasing in the connected order by one from $(2^{n-m}-1)$ to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: a string of resistors in which $(2^{n-m}-1)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group, the other end of said string of the resistors being connected to said second reference voltage source.

40. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R \cdot R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ connected in series, the number of the resistors in each of said strings of the resistors decreasing in the connected order by one from $(2^{n-m}-1)$ to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: a string of resistors in which $(2^{n-m}-2)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$.

41. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R \cdot R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ connected in series, the number of the resistors in each of said strings of the resistors decreasing in the connected order by one from $(2^{n-m}-1)$ to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: a string of resistors in which ($2^{n-m}-2$) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$, the other end of said string of the resistors being connected to said second reference voltage source.

42. A resistance ladder which divides a potential difference between first and second reference voltage sources into $2^n$ levels, comprising:

a first resistance group comprising: a string of resistors in which plural resistors are connected in series with a total sum of resistances being $(2^m-1)\cdot R-R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: ($2^{n-m}-1$) strings of resistors consisting of resistors each having a resistance of $R/2^{n-m}$ connected in series, the number of the resistors in each of said strings of the resistors decreasing in the connected order by one from ($2^{n-m}-1$) to one; and connecting means for selectively connecting any one end of said string of the resistors, or all the other ends of said strings of the resistors to said first reference voltage source which supplies a higher voltage, said other ends of the strings of the resistors being commonly connected to one end of said first resistance group through a resistor having a resistance of $R/2^{n-m}$; and a third resistance group comprising: ($2^{n-m}-2$) strings of resistors consisting of resistors each having a resistance of $R/2^{n-m}$ are connected in series, the number of the resistors in each of said strings of the resistors decreasing in the connected order by one from ($2^{n-m}-2$) to one; and connecting means for selectively connecting either one end of said strings of the resistors, or all the other ends of said strings of the resistors to said second reference voltage source, said other ends of the strings of the resistors being commonly connected to the other end of said first resistance group via a resistor having a resistance of $R/2^{n-m+1}$.

43. A resistance ladder which divides a potential difference between first and second reference voltage sources into $2^n$ levels, comprising:

a first resistance group comprising: a string of resistors in which plural resistors are connected in series with a total sum of resistances being $(2^m-1)\cdot R$ (where n>m); and $2^m$ ladder taps respectively connected to nodes of the resistors and one end of said string of the resistors to take out respective division voltages of the potential difference between said first and second reference voltage sources;

a second resistance group comprising: ($2^{n-m}-1$) strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: a string of resistors in which ($2^{n-m}-1$) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group.

44. A resistance ladder which divides a potential difference between first and second reference voltage sources into $2^n$ levels, comprising:

a first resistance group comprising: a string of resistors in which plural resistors are connected in series with a total sum of resistances being $(2^m-1)\cdot R$ (where n>m); and $2^m$ ladder taps respectively connected to nodes of the resistors and one end of said string of the resistors to take out respective division voltages of the potential difference between said first and second reference voltage sources;

a second resistance group comprising: ($2^{n-m}-1$) strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: a string of resistors in which ($2^{n-m}-1$) resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group, the other end of said string of the resistors being connected to said second reference voltage source.

45. A resistance ladder which divides a potential difference between first and second reference voltage sources into $2^n$ levels, comprising:

a first resistance group comprising: a string of resistors in which plural resistors are connected in series with a total sum of resistances being $(2^m-1)\cdot R$ (where n>m); and $2^m$ ladder taps respectively connected to nodes of the resistors and one end of said string of the resistors to take out respective division voltages of the potential difference between said first and second reference voltage sources;

a second resistance group comprising: ($2^{n-m}-1$) strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: $(2^{n-m}-1)$ strings of resistors consisting of resistors each having a resistance of $R/2^{n-m}$ are connected in series, the number of the resistors in each of said strings of the resistors decreasing in the connected order by one from $(2^{n-m}-1)$ to one; and connecting means for selectively connecting either one end of said strings of the resistors, or all the other ends of said strings of the resistors to said second reference voltage source, said other ends of the strings of the resistors being commonly connected to the other end of said first resistance group.

46. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R \cdot R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: a string of resistors in which $(2^{n-m}-2)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$.

47. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R \cdot R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: a string of resistors in which $(2^{n-m}-2)$ resistors each having a resistance of $R/2^{n-m}$ are connected in series; and connecting means for selectively connecting either ends of said string of the resistors or one of the nodes of the resistors to said second reference voltage source, the one end of said string of the resistors being connected to said first resistance group via a resistor having a resistance of $R/2^{n-m+1}$, the other end of said string of the resistors being connected to said second reference voltage source.

48. A resistance ladder which divides a potential difference between first and second reference voltage sources into $2^n$ levels, comprising:

a first resistance group comprising: a string of resistors in which plural resistors are connected in series with a total sum of resistances being $(2^m-1) \cdot R \cdot R/2^{n-m+1}$ (where n>m); and $2^m$ ladder taps respectively connected to nodes of the resistors and one end of said string of the resistors to take out respective division voltages of the potential difference between said first and second reference voltage sources;

a second resistance group comprising: $(2^{n-m}-1)$ strings of resistors consisting of resistors each having a resistance of $R/2^{n-m}$ are connected in series, the number of the resistors in each of said strings of the resistors decreasing in the connected order by one from $2^{n-m}$ to one; and connecting means for selectively connecting any one end of said series of the resistors to said first reference voltage source which supplies a higher voltage, said other ends of the series of the resistors being commonly connected to one end of said first resistance group; and a third resistance group comprising: $(2^{n-m}-2)$ strings of resistors consisting of resistors each having a resistance of $R/2^{n-m}$ are connected in series, the number of the resistors in each of said strings of the resistors decreasing in the connected order by one from $(2^{n-m}-2)$ to one; and connecting means for selectively connecting either one end of said strings of the resistors, or all the other ends of said strings of the resistors to said second reference voltage source, said other ends of the strings of the resistors being commonly connected to the other end of said first resistance group via a resistor having a resistance of $R/2^{n-m+1}$.

* * * * *

UNITED STATES PATENT AND TRADEMARK OFFICE
CERTIFICATE OF CORRECTION

PATENT NO. : 5,617,091
DATED : April 1, 1997
INVENTOR(S) : Nobuya UDA

It is certified that error appears in the above-indentified patent and that said Letters Patent is hereby corrected as shown below:

On the title page, item [73] should read as follows:

--[73] Assignee: Mitsubishi Denki Kabushiki Kaisha, Tokyo; Mitsubishi Electric Semiconductor Software Co., Ltd., Hyogo, both of Japan.--

Signed and Sealed this

Twenty-sixth Day of August, 1997

Attest:

BRUCE LEHMAN

*Attesting Officer*  *Commissioner of Patents and Trademarks*